(12) United States Patent
Rolston et al.

(10) Patent No.: US 7,729,581 B2
(45) Date of Patent: Jun. 1, 2010

(54) OPTICALLY-ENABLED INTEGRATED CIRCUIT PACKAGE

(75) Inventors: David Robert Cameron Rolston, Beaconsfield (CA); Richard Mainardi, Montreal (CA); Shao-Wei Fu, Montreal West (CA)

(73) Assignee: Reflex Photonics Inc., Montreal, Quebec (CA)

( * ) Notice: Subject to any disclaimer, the term of this patent is extended or adjusted under 35 U.S.C. 154(b) by 354 days.

(21) Appl. No.: 11/745,081

(22) Filed: May 7, 2007

(65) Prior Publication Data

US 2007/0258683 A1 Nov. 8, 2007

Related U.S. Application Data

(60) Provisional application No. 60/797,747, filed on May 5, 2006, provisional application No. 60/798,301, filed on May 8, 2006, provisional application No. 60/894,998, filed on Mar. 15, 2007.

(51) Int. Cl.
*G02B 6/26* (2006.01)
*G02B 6/30* (2006.01)
*G02B 6/36* (2006.01)
*G02B 6/42* (2006.01)

(52) U.S. Cl. .............. 385/52; 385/49; 385/88; 385/92

(58) Field of Classification Search ........... 385/49, 385/52, 88–94

See application file for complete search history.

(56) References Cited

U.S. PATENT DOCUMENTS

| 5,625,734 | A | * | 4/1997 | Thomas et al. | 385/88 |
| 6,056,448 | A | * | 5/2000 | Sauter et al. | 385/92 |
| 6,081,997 | A | * | 7/2000 | Chia et al. | 29/841 |
| 6,318,909 | B1 | * | 11/2001 | Giboney et al. | 385/90 |
| 6,450,704 | B1 | * | 9/2002 | O'Connor et al. | 385/92 |
| 6,511,233 | B1 | | 1/2003 | Steijer et al. | |
| 6,767,140 | B2 | | 7/2004 | Pendse et al. | |
| 7,128,474 | B2 | * | 10/2006 | Giboney et al. | 385/92 |
| 2003/0031431 | A1 | * | 2/2003 | Kunkel et al. | 385/92 |
| 2005/0062119 | A1 | | 3/2005 | Gallup et al. | |
| 2005/0191003 | A1 | | 9/2005 | Yorks et al. | |

OTHER PUBLICATIONS

International Search Report Form PCT/ISA/210 pp. 1-5.

* cited by examiner

*Primary Examiner*—Daniel Petkovsek
(74) *Attorney, Agent, or Firm*—Ogilvy Renault, LLP

(57) ABSTRACT

An optically-enabled integrated circuit (IC) package for connecting an electrical circuit board to an optical fiber is presented. The IC package comprises an OSA having a laser which is pre-aligned with the optical fiber. The OSA further comprises a standard electrical interface for the connection to the microchip and a standard optical interface for the connection to the optical fiber. A set of mechanical concepts for connecting optical connectors and cables to integrated circuit packages is also presented and can be applied for any type of optical connector such as single optical fiber ferrules, MT-RJ type optical ferrules and 2-D MT-type optical ferrules.

7 Claims, 35 Drawing Sheets

OPTICALLY-ENABLED INTEGRATED CIRCUIT PACKAGE

CROSS-REFERENCE TO RELATED APPLICATIONS

The present application claims priority under 35 U.S.C. §119(e) of U.S. provisional patent application No. 60/797,747 filed May 5, 2006 entitled OPTICALLY ENABLED INTEGRATED CIRCUIT PACKAGE by Rolston et al., U.S. provisional patent application No. 60/798,301 filed May 8, 2006 entitled OPTICALLY ENABLED INTEGRATED CIRCUIT PACKAGE by Rolston et al., and U.S. provisional patent application No. 60/894,998 filed Mar. 15, 2007 entitled OPTICAL MATING FOR OPTICALLY-ENABLED IC PACKAGES by Rolston et al. The specifications of the foregoing provisional applications are hereby incorporated by reference.

FIELD OF THE ART

The present disclosure relates to the field of integrated circuit (IC) packages for ultra-high speed optical interconnection applications.

BACKGROUND OF THE ART

The efficient transmission of data between the integrated circuit (or microchip) and the external world has been the focus of intense engineering for IC package manufacturers over the past several years as signal data rates as well as the number of signals are pushed to the physical limits of electrical technology.

Typical industry standard IC packages such as the ball grid array (BGA) package have been able to keep pace with the data rate and pin-out demands from leading edge microchip designers but are steadily facing an ever more challenging set of criteria for density and data rates in the face of growing power consumption concerns. This is exacerbated by the trend towards multi-processor microchip architectures that must draw ever more data from the external world.

The trend towards optical interconnects in the communications and network industries has been based on the trade-off between distance and data rate. As data rates have increased, optical fiber has replaced copper wire (given the same physical distance) so that the higher speed signals are not degraded. It is this trend that has inspired the concept of "fiber to the chip", where the ultra-high speed electrical signals between the microchip and the outside world are replaced with optical signals. Both the speed and the density issues can then be addressed into the next decade by allowing the microchip to remain as an all-electrical processing unit and have the optical fiber be the ultimate conduit of high speed data to and from the microchip.

There are many examples where light emitting devices have been coupled to and from optical fibers within electrical packages. Work done by the Photonic and Wireless Device Research Laboratories of the NEC Corporation and described by patents such as U.S. Pat. No. 6,901,185 show unique methods of directing and controlling light signals for compact optical modules. Alternative methods, such as those described by the Intel Corporation in patent applications such as US#2002/0196997 show highly integrated methods of incorporating lasers into microchips within the same packages. Other more aggressive means of directing light into the microchip itself have been demonstrated by Luxtera Inc. and part of their technique is illustrated in patent application US#2004/0156590. This technique uses a modulation effect within the silicon itself to produce optical pulses of light directly from the processing chip.

However, none of these technologies have properly addressed the issues of modularity and industry standard form-factor for the semiconductor market. Most of these competing technologies rely on highly vertically integrated assembly techniques where the optical interface is dependent on several layers of alignment steps including micro flip-chipping and precision pick-and-place alignment resulting in a final package that is very specific to the task of converting between electrical and optical signals. There is no provision for a user defined microchip, such as a microprocessor or a switch, to be placed directly along side an optical-to-electrical or electrical-to-optical converter module within the same package. These technologies also rely heavily on the technical sophistication of the integrated circuit package assembly house to provide optically enabled packages.

The ability to merge optics with the computing power of the microchip in the same package, and have the package conform to all the norms of other standard packages both in performance and assembly methodology will allow advances in computer inter-connectivity.

Additionally, a very significant amount of work in both the standardization and product development of optical fiber connectors has been carried over the past several decades. Numerous methods used for mechanical alignment of optical fibers with other optical fibers or optoelectronic modules for permanent and removable connections have been devised. This effort has culminated in various standard optical connector types and optical housings for standard multimode and single-mode optical fibers as well as plastic optical fibers and specialty optical fibers. It has also produced standard types of multi-fiber optical connectors for density improvements and alignment with 1 and 2 dimensional arrays of light emitting and receiving elements. Examples of standard optical connector housings are the LC, FC, SC, and MPO (among others). These connectors typically use at least one precision-machined or precision-molded part containing the optical fiber(s) such as a zirconia ferrule or micro-molded plastic ferrule. The precision part is typically polished on one end to ensure the tips of the optical fibers are flat (although sometimes rounded or at a tilt angle) and allow a maximum amount of light to be coupled into or out-of the optical fiber. The connector housing that surrounds this precision part usually has an attachment mechanism such as a threaded barrel, a plastic snap or clip, or a spring-loaded "floating" assembly to help direct the optical fiber into the ideal position. The mating housing on an optoelectronic module or a passive optical adapter that the connector is mated with will typically have a complementary set of features, such as a precision-machined hollow barrel or a set of precision-molded dowel pin holes. The housing or adapter will also have a complementary set of mechanical attachment features such as a threaded hole, a plastic notch or groove, or a plastic inner adapter to which the connector housing clasps or screws-on. This clasping mechanism is often spring loaded (in some way—either by actual coiled springs, spring steel or compressible plastic or rubber) and offers a positive mating force between the optical fiber and the optoelectronic module or other optical fiber. This force is used to maintain a constant optical coupling between the two optical fibers as well as offer a certain degree of protection from debris that might infiltrate the interface otherwise.

Most optical connectors include both the precision optical part (zirconia ferrule or micro-molded plastic ferrule) and the mechanical attachment mechanism as a single, complete connector assembly on the end of a fiber optical cable. However, there are some mechanical attachment mechanisms that are offered independently from the precision optical part. Examples of these "external" clips can be found in U.S. Pat. No. 5,721,798—by Kanda et al. entitled "Connection Structure for an Optical Waveguide Device and Method of Fabricating the Same"—as an example of a multi-fiber optical connecting mechanism, and U.S. Pat. No. 4,741,590—by Caron entitled "Fiber Optic Connector"—as an example of a single optical fiber connection mechanism.

Further to this, there are various examples of connector housings that allow optical fiber cables to be mated with optoelectronic modules such that the optical fibers are aligned with lasers or photodetectors. The most notable examples of such housings are the standard optical transceiver products such as the SFP, XFP and XANPAK transceiver form-factors—these parts align to dual-LC terminated optical fiber cables. Examples can be found as product offerings by companies such as Finisar Inc. (http://www.finisar.com), Bookham (http://www.bookham.com/), and Intel (http://www.intel.com/design/network/products/optlical/lc transceivers.htm).

The demand for higher data rates and greater aggregate bandwidths leads to the development of hybrid integrated circuit packages that include optical connector interfaces. This hybrid approach brings the optical signals directly to the silicon microchip inside the package thereby alleviating the considerable design and fabrication challenges of very high speed electrical signaling.

Although there have been many methods described that address the placement and alignment of the light-emitting or receiving optoelectronics within standard and non-standard integrated circuit packages, remarkably few optical connectors and connector housings have been suggested for integrated circuit packages. US Patent Application 2003/0031431—by Kunkel et al. entitled "Assembly for aligning an optical array with optical fibers"—describes a clip design that wraps around the package housing and holds on to the back of the package while pushing the optical connector towards the optical interface of the package. U.S. Pat. No. 6,511,233—by Steijer et al. entitled "Spring Clip"—is a similar concept for clasping an external clip to the package while using a spring clip design to push the optical connector on to the optical interface of the package.

SUMMARY

In an aspect, this disclosure relates to the hybrid integration of optical, optoelectronic and electronic components into standard ball grid array IC packages, and to the mechanical mechanisms used to connect optical fiber cables with optically enabled integrated circuit packages.

To address the issues of modularity and form-factor, we propose to leverage industry standard integrated circuit (IC) package form-factors such as pin-grid array (PGA) and ball-grid array (BGA) packages and augment them with planar, modular, optical sub-assemblies. This will form a hybrid optical IC package that contains both the standard electrical connections of typical IC packages as well as one or more optical ports on the sides of the package to allow optical signals to propagate to within millimeters of the microchip. These new "optically enabled" packages will continue to be assembled using standard assembly techniques such as chip-attach, wirebonding, flip-chipping, glob-top encapsulation, solder balling, and solder re-flowing so as not to disrupt the well established industry IC packaging production lines. In addition to this, the microchip designers and manufacturers will not have to modify their architectures or physical layouts since the optical conversion will occur away from the microchip. However, since the optical conversion occurs only millimeters from the microchip very high data rates can still be achieved without an exponential increase in power as in the all-electrical signaling case. Furthermore, because of the fidelity of optical signals and their immunity to crosstalk and electromagnetic effects, the rate at which electrical power is consumed by the microchip is reduced relative to the all-electrical signaling case. The reason is that an optical signal requires far less signal conditioning and signal correction (fewer transistors overall) than equivalent electrical-only signaling methods above 1-Gb/s. This allows much lower cost per gigabit per second per watt.

Some aspects of this disclosure are as follows: 1) optical alignment issues for the IC package assembly and printed circuit board (PCB) assembly are eliminated since the optical sub-assemblies have been pre-aligned optically and can be simply "dropped" into place and connected to the microchip via electrical interconnections such as wirebonds, 2) The optical sub-assembly has a standard electrical interface for the microchip in the IC package and a standard optical interface for external optical fiber cabling, 3) The chip designers and chip manufacturers do not have to alter their architectures or fabrication methods, 4) very dense and very high speed data rates can be offered directly to and from the microchip since the optical conversion takes place only a few millimeters from the microchip, 5) the typical high speed copper traces to and from the package are not necessarily required simplifying the motherboard design and eliminating extra components such as optical transceivers for the design, and 6) the rate at which electrical power is consumed is reduced for ever faster input and output signals to and from the IC package.

Additionally, a set of mechanical concepts for connecting optical connectors and cables to integrated circuit packages is presented that targets the field of hybrid optically enabled integrated circuit (IC) packaging. These principles have initially been designed based on the multi-terminal (MT) optical ferrule (invented by NTT) for a 1-D linear array of parallel optical fiber ribbon. However, similar concepts could be envisioned for any type of optical connector including single optical fiber ferrules, MT-RJ type optical ferrules and 2-D MT-type optical ferrules.

In an embodiment, the concept is to provide simple features surrounding the optical ports of the hybrid optically enabled IC package as well as simple attachment clips to provide mating forces between the MT optical ferrule and the optical ports on the sides of a hybrid optical IC package. This must be accomplished with a minimum amount of physical intrusiveness with respect to both the IC package and the surrounding printed circuit board (PCB). Both the PCB designer and the PCB assembler wish to minimize the size of any optical connections on the physical layout of the PCB—reserving board area on the PCB for parts that are not electrical and would never directly connect to the PCB is not an efficient use of space. It is desirable that the entire optical assembly be only slightly larger than the optical MT ferrule itself and not require any significant re-positioning of the other components on the PCB—such as heat sinks, fans, sockets, or adapters.

In keeping with standard practices for PCB assembly, the optical port and mating clip are designed to be connected during the final stages of board or equipment assembly and not require any special tools for assembly. According to this aspect, the technicians in the field may manually connect the optical fiber cables to the IC packages. The optical fiber cables should therefore have the same characteristics as more conventional electrical cabling connectors within computer boxes. Furthermore, the mating clip allows for several versions of optical ports to be designed and can also allow for multiple optical ports per IC package if located around the perimeter of the IC package.

According to an embodiment, there is provided an optically-enabled integrated circuit package for connecting an electrical circuit board to an optical fiber. The package comprises: a user defined microchip; a substrate comprising electrical connections for routing signals between the microchip and the electrical circuit board; and an optical sub-assembly (OSA) having a laser which is pre-aligned with the optical fiber, the OSA further comprising an standard electrical interface connecting the OSA to the microchip and an standard optical interface for connecting to the optical fiber, the OSA thereby connecting the microchip to the laser which is in turn optically connected to the optical fiber.

According to an embodiment, there is provided an optically-enabled integrated circuit package for connecting an electrical circuit board to an optical fiber. The package comprising: a user-defined microchip that is controlled-collapse chip connected (C4) using micro-solder balls with an underfill; a substrate comprising electrical connections for routing signals between the microchip and the electrical circuit board; a mold or an encapsulation for creating a housing over the microchip; and an optical sub-assembly (OSA) having a laser which is pre-aligned with the optical fiber, the OSA further comprising an standard electrical interface connecting the OSA to the microchip and an standard optical interface for connecting to the optical fiber, the OSA thereby connecting the microchip to the laser which is in turn optically connected to the optical fiber.

According to an embodiment, the present disclosure describes an optically-enabled integrated circuit package for interfacing an electrical circuit board with an optical fiber, the package comprising a user defined microchip; an interposer board (to route signals between the microchip and the external world); a metal backing (or heat-spreader plate); wirebonds connecting the microchip and the metal backing; glob-top encapsulation epoxy covering the microchip and the wirebonds; solder balls (typically 0.8-mm diameter pitched at 1.27-mm in both directions of a regular matrix array) for connection to the electrical circuit board; and an optical sub-assembly (OSA) [100] for connecting the microchip to a laser which is in turn optically connected to the optical fiber, the OSA having a laser which is pre-aligned with the optical fiber, the OSA further comprising standard electrical interface for the connection to the microchip and a standard optical interface for the connection to the optical fiber.

According to an embodiment, the present disclosure describes an optically-enabled integrated circuit package for interfacing an electrical circuit board with an optical fiber, the package comprising: a user-defined microchip that is controlled-collapse chip connected (C4) using micro-solder balls (with an underfill); an interposer board (to route signals between the microchip and the external world); mold or encapsulation for creating the housing over the microchip (this also may include some amount of glob-top encapsulation epoxy); solder balls (typically 0.8-mm diameter pitched at 1.27-mm in both directions of a regular matrix array) for connection to the electrical circuit board; and an optical sub-assembly (OSA) connected to the interposer board using either wirebonding or flip-chipping and for connecting the microchip to a laser which is in turn optically connected to the optical fiber, the OSA having a laser which is pre-aligned with the optical fiber, the OSA further comprising standard electrical interface for the connection to the microchip and a standard optical interface for the connection to the optical fiber.

According to an embodiment, there is provided a mating clip for securing a connection between an optical connector and an optical port of a hybrid optically enabled integrated circuit package, the optical connector having an optical cable end to which is attached an optical cable and having a connector end opposite the optical cable end. The mating clip comprises: a cover for substantially covering the optical connector, the cover comprising an opening to permit passage of the optical cable; an S-shaped curved feature extending from the cover and for applying a force against the optical cable end; and a hook-shaped feature extending from the cover in the direction of the connector end of the optical connector and for securing an assembly formed by the mating clip and the optical connector to the optical port; wherein, in the securing of mating clip/optical connector assembly, the hook-shaped feature interacts with at least one of a notch internal to the hybrid optically enabled integrated circuit package; and a protrusion on the optical port.

According to an embodiment, there is provided a method for using a mating clip for securing a connection between an optical connector and an optical port of a hybrid optically enabled integrated circuit package, the method comprising: providing a mating clip having a hook-shaped feature extending therefrom; inserting the optical connector within the mating clip, thereby forming an mating clip/optical connector assembly; and securing the mating clip/optical connector assembly to the optical port using an interaction between the hook-shaped feature and at least one of a notch internal to the hybrid optically enabled integrated circuit package; and a protrusion on the optical port.

According to an embodiment, there is provided a method for assembling a package, the package being for connecting an electrical circuit board to an optical fiber, the method comprising: providing a substrate comprising electrical connections for routing signals between a user-defined microchip and the electrical circuit board; providing an optical sub-assembly (OSA) having a laser which is pre-aligned with the optical fiber, the OSA further comprising an standard electrical interface for connecting the OSA to the user defined microchip and a standard optical interface for connecting to the optical fiber; providing a box housing comprising a first zone for inserting the microchip and a second zone for inserting the OSA; attaching the housing on top of the substrate; and sliding the OSA laterally through the second zone until the standard electrical interface starts protruding into the first zone.

According to an embodiment, there is provided a method of assembling a package for connecting an electrical circuit board to an optical fiber, the method comprising: providing a substrate comprising electrical connections for routing signals between a user-defined microchip and the electrical circuit board, the substrate comprising solder pads; providing an optical sub-assembly (OSA) having a laser which is pre-aligned with the optical fiber, the OSA further comprising a standard electrical interface connecting the OSA to the user-defined microchip and a standard optical interface for connecting to the optical fiber; connecting the OSA onto the substrate, by aligning the standard electrical interface with the electrical connections of the substrate; connecting the user-defined microchip to the solder pads using micro-solder balls; and encapsulating the user-defined microchip and the OSA with a housing.

DESCRIPTION OF THE DRAWINGS

In order that the invention may be readily understood, embodiments of the invention are illustrated by way of example in the accompanying drawings.

Further details of the invention and its advantages will be apparent from the detailed description included below.

DETAILED DESCRIPTION

In the following description of the embodiments, references to the accompanying drawings are by way of illustration of an example by which the invention may be practiced. It will be understood that other embodiments may be made without departing from the scope of the invention(s) disclosed.

In one embodiment of the present invention, a modified cavity-down ball grid array (BGA) integrated circuit (IC) package is proposed that incorporates mechanical clearances for a modular optical sub-assembly. The optical sub-assembly (OSA) is a modular, low-profile, low-cost component with a standard electrical interface and a standard optical interface and is placed within the IC package between a user defined microchip and the side-face of the IC package. The standard optical interface on the side of the IC package also includes a means to clip or mate (and unmate) an optical patch cable directly to the side of the package. The finished optically enabled BGA IC package can then be mounted to a printed circuit board (PCB) through standard assembly means where the optical interface is connected at a later time independently from the PCB assembly.

Optical Sub-Assembly (OSA)

The optical sub-assembly (OSA) used to optically enable an IC package in this disclosure is defined as a module that is capable of converting between electrical signals and optical signals. It is an optically aligned module that can be placed within the IC package. It is a compact, low-profile module with a standard electrical interface (such as gold pads for wirebonding or flip-chipping) and a standard optical interface (such as the mechanical transfer (MT) multi-fiber optical ferrule which incorporates high precision molding and alignment dowel pins and originally developed by NTT).

Figure 1:
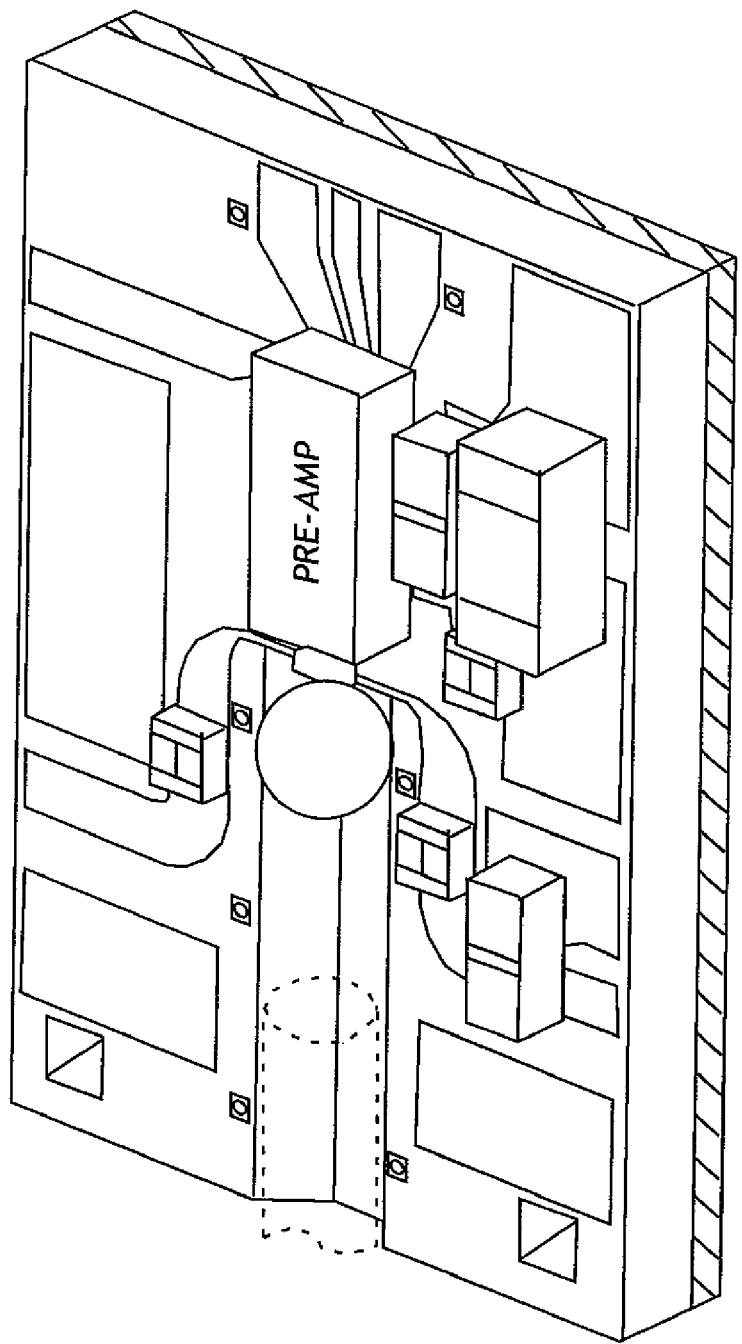
FIG. 1 is a schematic perspective view of a DFB planar OSA according to prior art.

The nature of the light emitted or received by the OSA is dependent only on the type of devices used. A vertical cavity surface emitting LASER (VCSEL) which has an optical wavelength of around 850-nanometers may be used in an embodiment. However, other light emitting devices are also envisioned such as the distributed feedback (DFB) laser which has longer optical wavelengths around 1550-nanometers. An example of such a longer-wavelength OSA that is aligned to single mode optical fiber on a Silicon Optical Bench platform is given in U.S. Pat. No. 6,862,378 by Karnacewicz et al. [see FIG. 1].

Figure 2A:
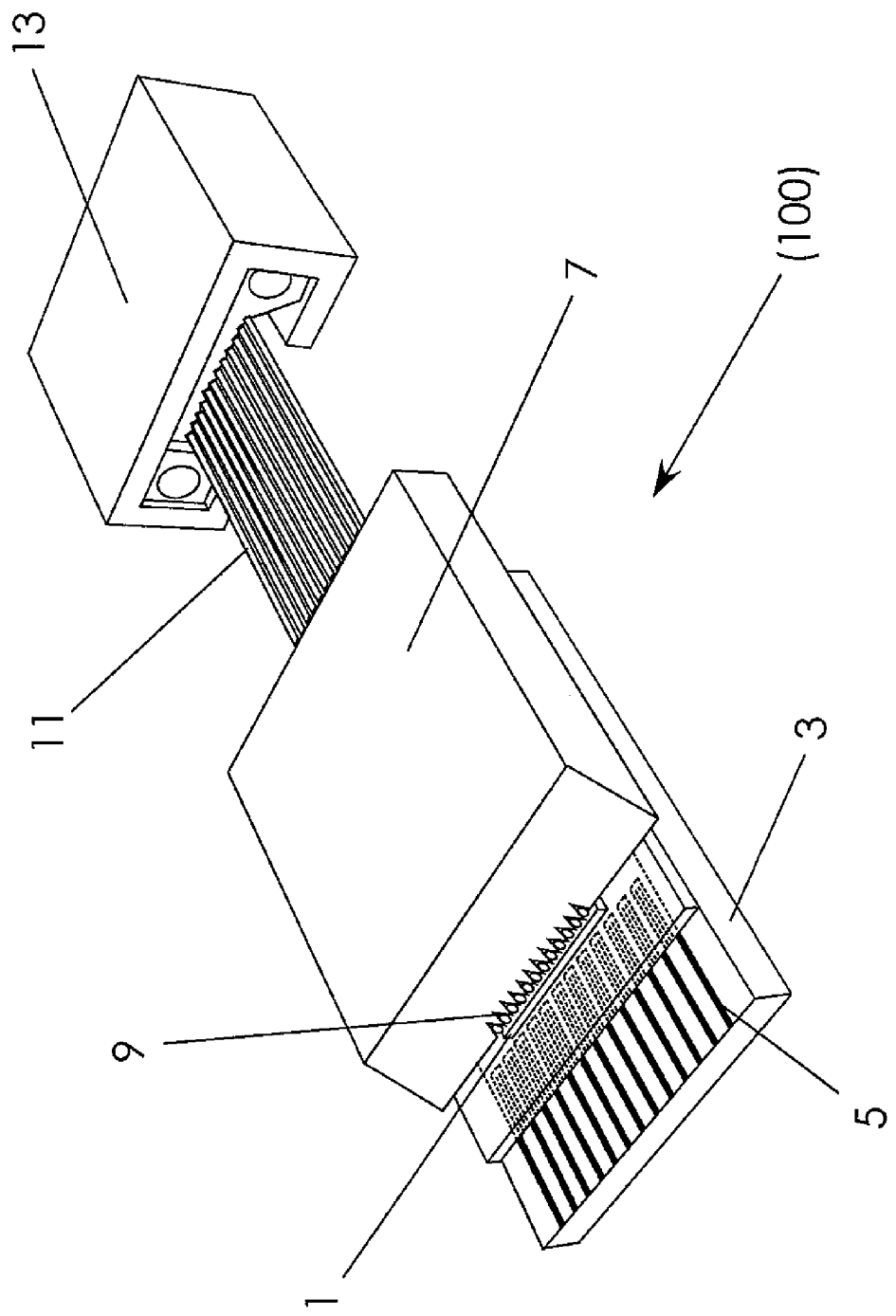
FIG. 2a is a schematic perspective view from the front of the VCSEL based OSA according to prior art.
Figure 2B:
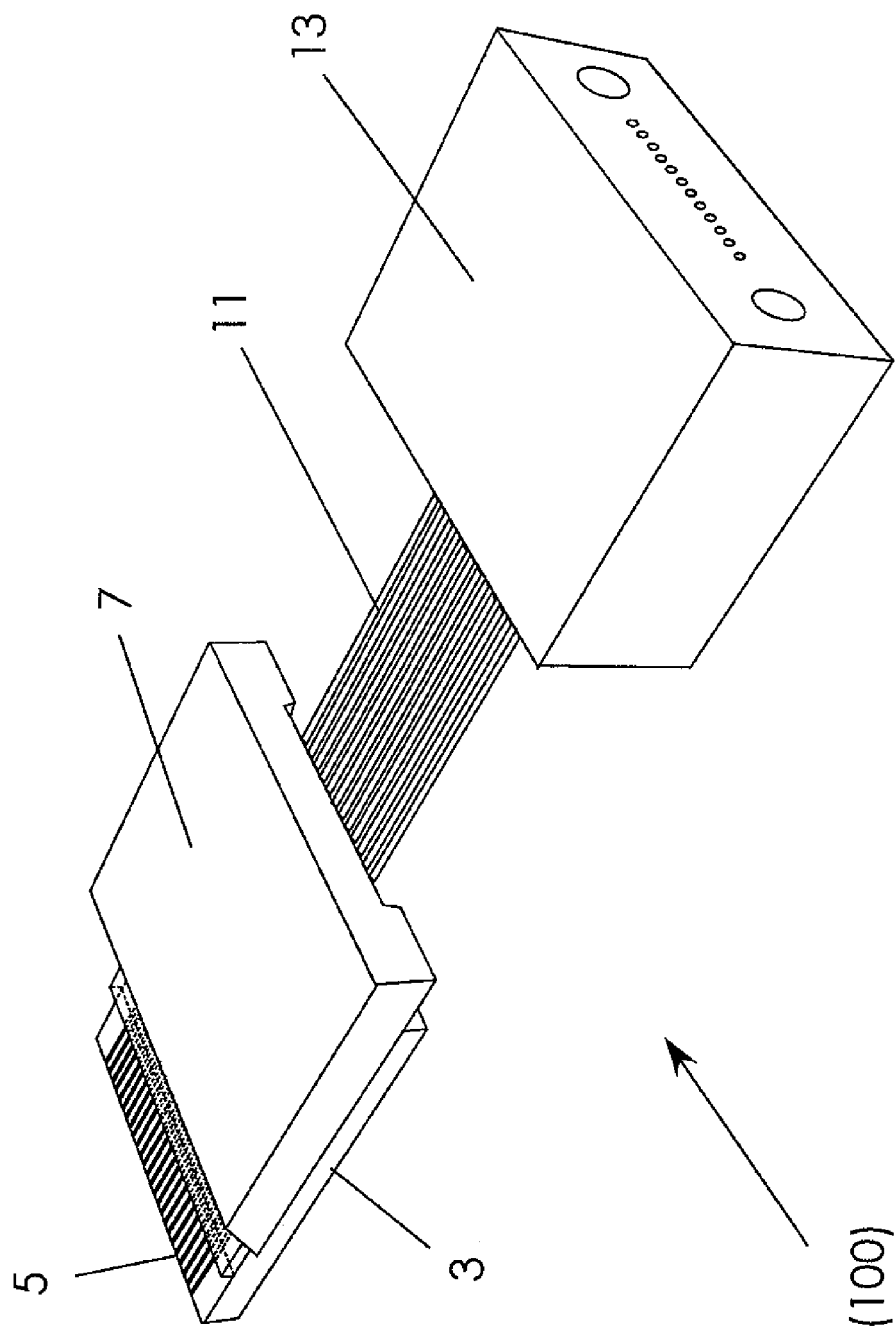
FIG. 2b is a schematic perspective view from the back of the VCSEL based OSA according to prior art.

An example of a VCSEL based OSA used to optically enable the IC package is described in the follwing U.S. patent applications: "Encapsulated Optical Package" US Patent Application No.: 2005/0121820 and "Optical Ferrule" US Patent Application No.: 2005/0018993 and "Optical Connector Assembly" US Patent Application No.: 2005/0018974 by Rolston et al. Referring to FIGS. 2a and 2b, this particular OSA is based on a Gallium Arsenide (GaAs) 1×12 VCSEL array (operating at 850-nanometer wavelength) pitched at 250-microns on a single chip substrate [1]. The 1×12 array VCSEL chip is bonded to an alumina substrate [3] and wirebonded to a pattern of gold trace lines [5] on the alumina. A silicon v-groove ferrule [7] holds a parallel optical ribbon fiber array of multimode optical fibers at a precise pitch of 250-microns and has its front facet beveled at 45-degrees and silver coated [9] to create a mirror capable of reflecting the light from the VCSEL array at 90-degrees and coupling the light into the multimode optical fibers [11]. The other end of the parallel optical ribbon fiber array of multimode optical fibers is terminated using a 12 channel MT ferrule [13] [see FIG. 2a and FIG. 2b]. The entire assembly is only 16-mm long, by 2.44-mm high, by 7-mm wide and provides electrical connections through the ends of the gold patterned trace lines. A similar OSA is used for detecting the light, but uses a 1×12 array of photodetectors.

In an embodiment, the OSA used to optically enable the IC package may be completely encapsulated—typically with standard types of epoxy resins. The need for encapsulation is a result of the very high temperatures involved in mounting IC packages to printed circuit boards (PCBs). Under typical solder reflow temperatures around 215° C., any air spaces within the encapsulation of an IC package may explode due to superheated humidity within the air space. Technologies for OSAs that use microlenses with air-spaces between the laser and the lens therefore may not be well suited for the optical enablement of IC packages.

Another detail of the OSA assembly is to include a dust/contamination cover over the optical interface of the OSA. For example, a small, tight-fitting rubber cap or a sticky tab can be secured over the optical interface of the OSA to maintain a clean surface all the way through the assembly and final integration of the optically enabled IC package on to a PCB. This can also protect the optical interface during the solder re-flow process of PCB assembly. The cover can be removed just before the optical fiber ribbon cable is connected to the side of the package.

Figure 3:
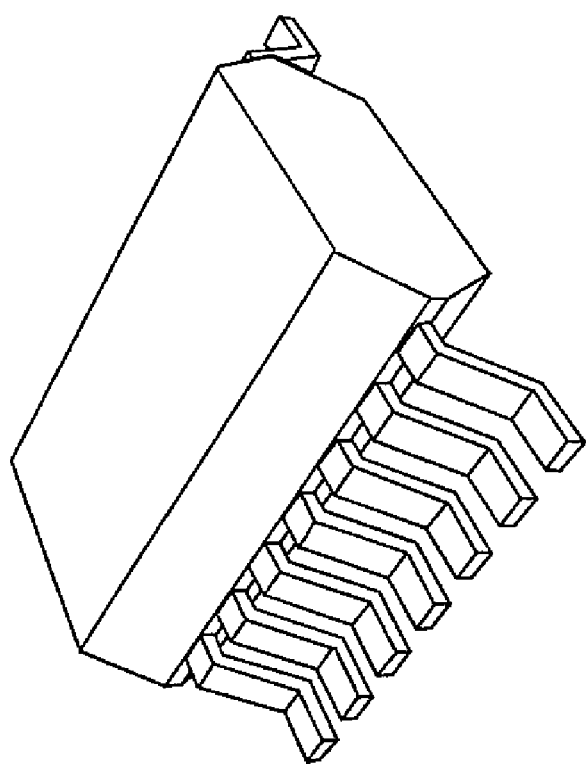
FIG. 3 is a schematic perspective view of a dual-in line package according to prior art.
Figure 4:
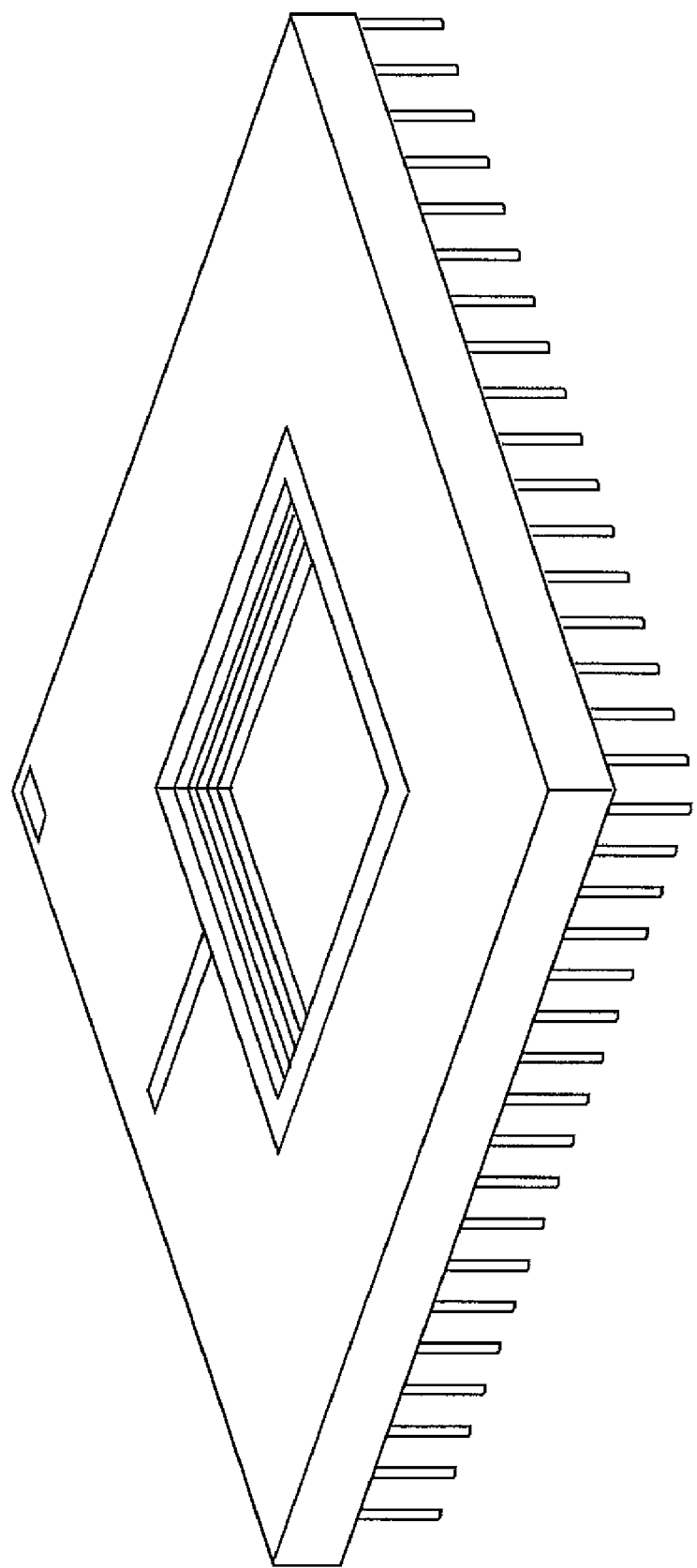
FIG. 4 is a schematic perspective view of a pin grid array package according to prior art.
Figure 5:
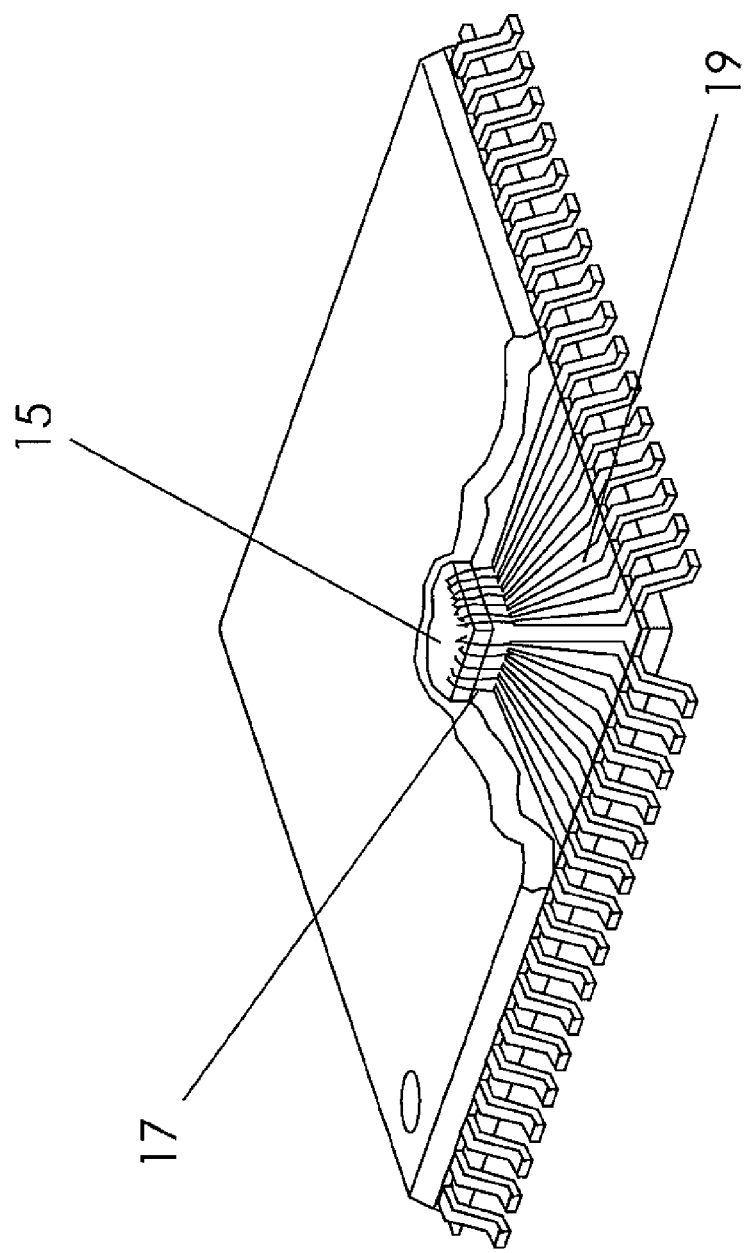
FIG. 5 is a schematic perspective view of the internal structure of a Quad-Flat Pack package according to prior art.

Integrated Circuit (IC) Packages. There are many standard types of IC packages available to the microchip manufacturer. These packages range in size, power dissipation capability, pin-count, and maximum data rate per pin among other things. The dual in-line package (DIP) [see FIG. 3] is an example of a low pin-count, low-speed package whereas the pin grid array (PGA) is an example of higher pin-count, medium-speed package [see FIG. 4]. Typically, a microchip manufacturer selects the IC package based on size and performance. As shown in FIG. 5, the assembly of the IC package involves the placement and attachment of the microchip [15] using either epoxy or solder reflow techniques into the central area of the IC package. It is electrically connected to the outside world either through wirebonding [17] or micro solder ball reflow in a process called controlled collapse chip connect (C4) first invented by IBM in the 1960's. A set of internal electrical traces lines [19] within the IC package lead from the microchip to the external pins or connections on the outside world; an example of a Quad-Flat Pack (QFP) package is shown [see FIG. 5].

According to an embodiment, one or more pre-aligned, modular OSAs are placed within a standard (or semi-standard) IC package along side a "user-defined" microchip. The OSAs are placed into the IC package using the same fundamental "pick-and-place" techniques used to place microchips into IC packages. Also, since the OSA has been optically pre-aligned (to provide both a standard optical and electrical interface) the need for any precision optical alignment by either the IC package manufacturer or the PCB assembly is eliminated. It should be noted that typical IC or PCB assembly techniques have alignment tolerances greater than +/−100-micrometers. The typical alignment tolerances required within the OSA, even with multimode optical fiber, are under +/−5-micrometers for proper optical uniformity and coupling ratios. Therefore, the pre-aligned OSA removes the task of precision alignment from the IC or PCB manufacturer. The optically enabled IC package then allows the microchip to not only access the normal electrical connections of the IC package but also optical connections through the OSA. The package can then be soldered to standard PCBs and optical patch cables can be attached at a later time.

Figure 6:
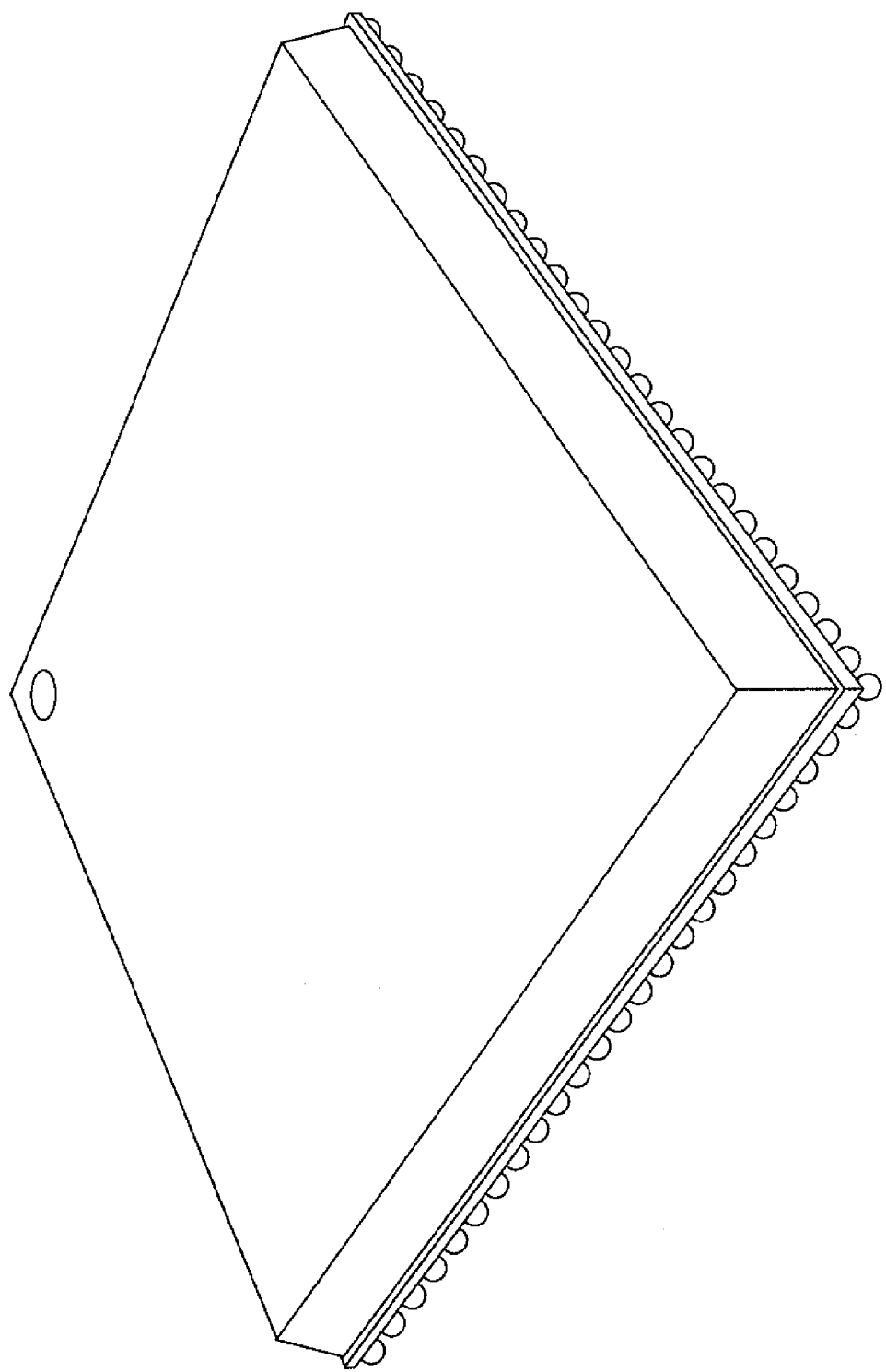
FIG. 6 is a schematic perspective view of a cavity-up ball grid array package according to prior art.
Figure 7A:
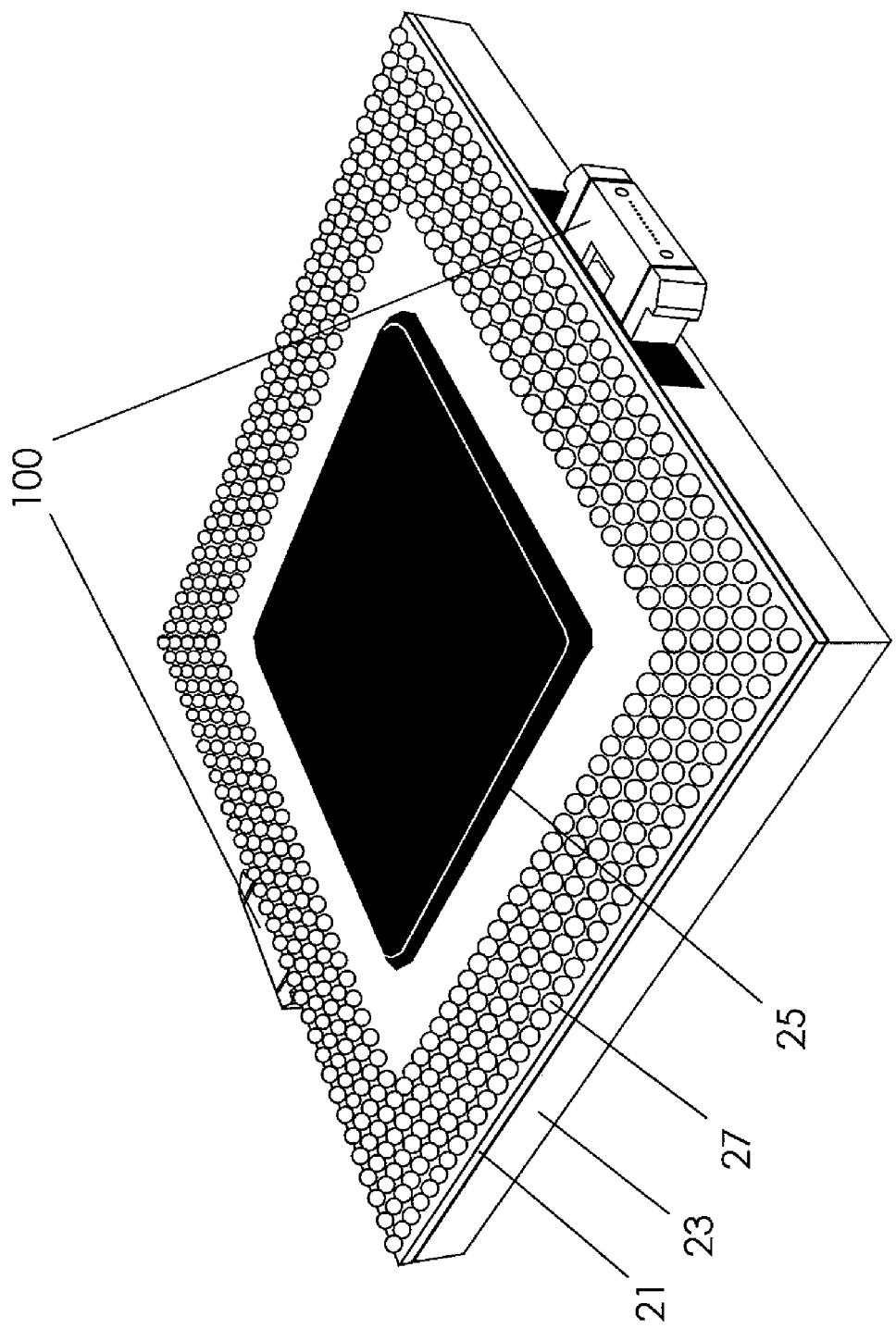
FIG. 7a is a schematic perspective view from the bottom of the complete optically enabled cavity-down BGA package according to an embodiment.
Figure 7B:
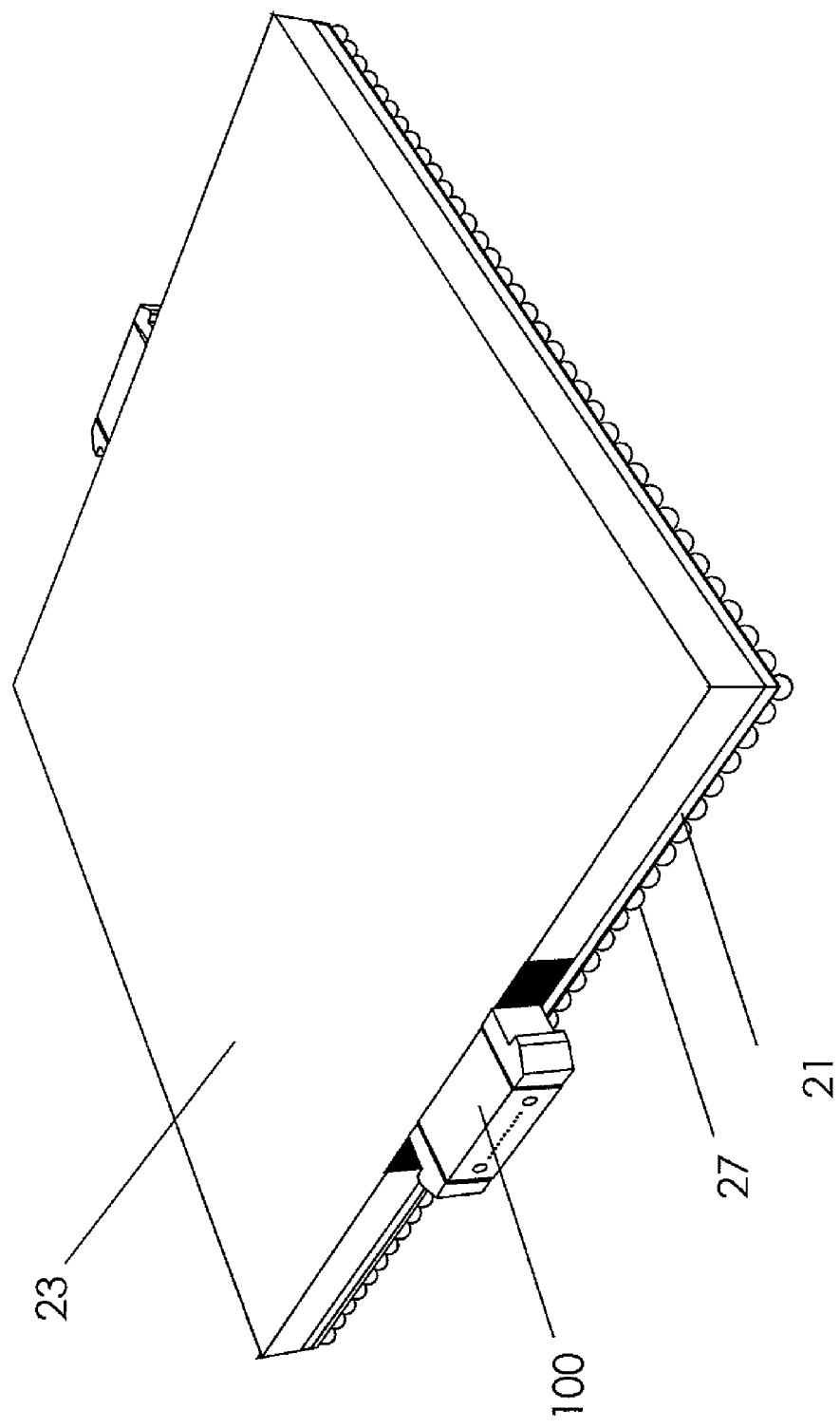
FIG. 7b is a schematic perspective view from the top of the complete optically enabled cavity-down BGA package according to an embodiment.

Although according to various embodiments, virtually any type of IC package may be optically enabled, this disclosure shows a ball grid array (BGA) IC package [see FIG. 6]. The BGA package was selected because it is a high-density, high-speed package typically used for very large processing microchips. The BGA package also comes in several flavors, two of which are the cavity-up and the cavity-down package styles. A BGA package can be made from ceramic materials or organic materials (like FR-4) and can also contain multiple chips such as multi-chip module (MCM) packages.

Within the following embodiments of optically enabled BGA IC packages the number of optical sub-assemblies (OSAs) will be limited to two (2); typically one transmitter OSA and one receiver OSA. It should be understood that more OSAs with higher or lower numbers of channels per OSA as well as different transmit or receive orientations are possible depending on the requirements of the user-defined microchip. The overall dimensions, reliability, performance and assembly methods for the IC packages are outlined by the JEDEC Solid State Technology Association (Once known as the Joint Electron Device Engineering Council) specifications (http://www.jedec.org) to which the optically enabled IC packages proposed here will meet to some degree.

Optically Enabled Cavity-Down BGA IC Package. One version of an optically enabled cavity-down BGA IC package [see FIGS. 7a, 7b, 8a, 8b and 9] consists of the following sub-parts:
 a. An interposer board [21] (to route signals between the microchip and the external world)
 b. A metal backing [23] (or heat-spreader plate)
 c. A user defined microchip [47]
 d. Wirebonds [49]
 e. Glob-top encapsulation epoxy [25]
 f. Solder balls [27] (typically 0.8-mm diameter pitched at 1.27-mm in both directions of a regular matrix array)
 g. One or more optical sub-assemblies (OSA) [100].

Figure 8A:
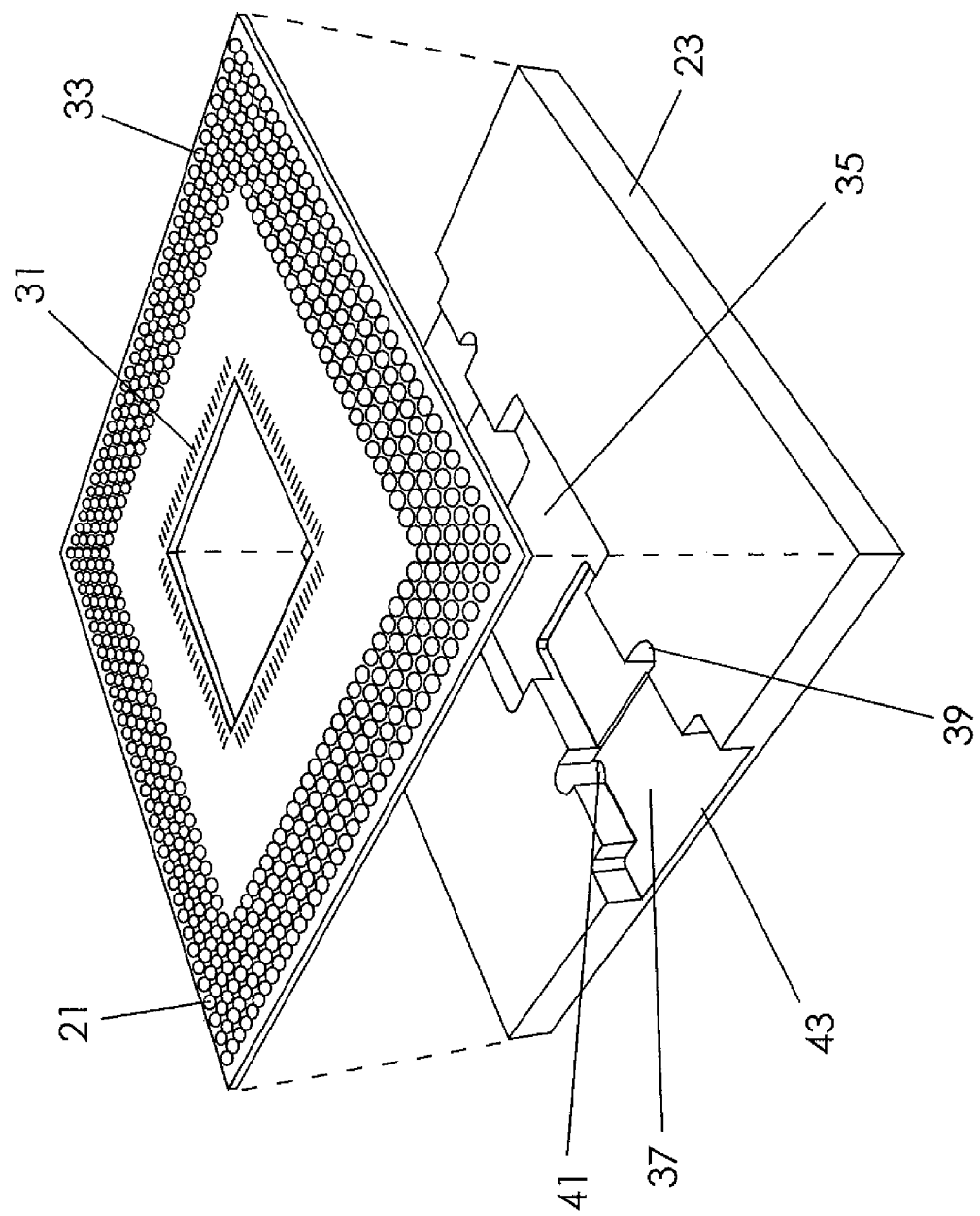
FIG. 8a is a schematic perspective view from the bottom of the optically enabled cavity-down BGA package before insertion of the OSA and the interposer separated from the metal backing, according to an embodiment.
Figure 8B:
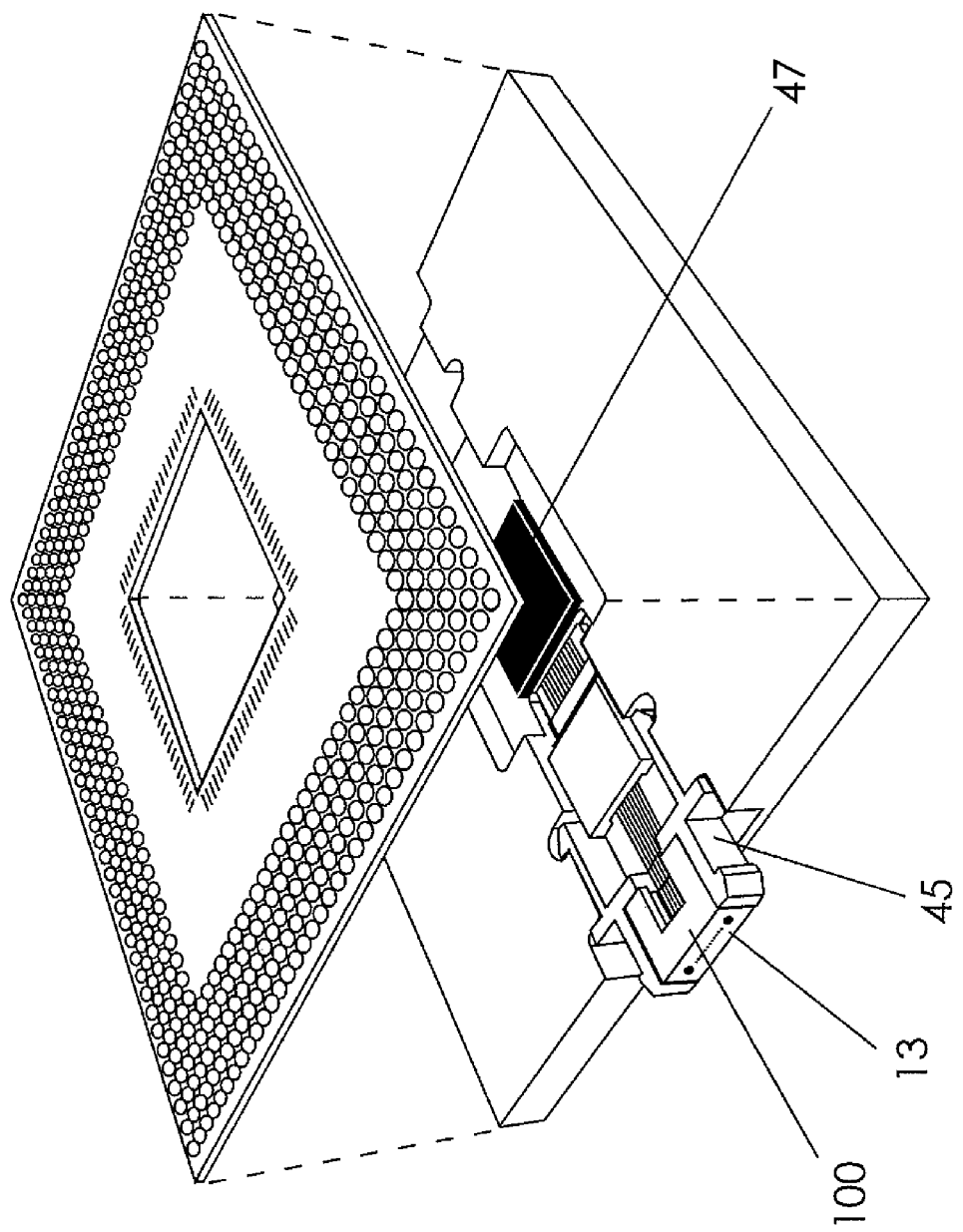
FIG. 8b is a schematic perspective view from the bottom of an optically enabled cavity-down BGA package with the microchip placed and wirebonded and the OSA inserted into the metal backing with the interposer separated from the metal backing, in accordance with an embodiment.

The interposer board [21] [see FIG. 8a] (also called a substrate) is the same size as the metal backing [23] and has a square opening in the center with wirebondable gold "fingers" [31] around the opening's perimeter. The interposer has a multilayer stack-up and contains ground layers, power layers and trace lines that route between the center square opening's perimeter bond fingers and each solder ball pad in the array [33].

The metal backing [23] [see FIG. 8a] is a thin rectangular block of aluminum metal 45-mm×45-mm×3.5-mm in size. The metal backing has two (2) specific zones. The first zone (ZONE 1) [35] is a recessed cavity that aligns to the square opening in the center of the interposer. ZONE 1 is where the user-defined microchip is placed. The second zone (ZONE 2) [37] is another recessed cavity where the OSA is placed. ZONE 2 provides space for the OSA between the microchip and the exterior side of the package. ZONE 2 also has extra features [39], such as grooves, for placing a mating clip assembly around the OSA, as well as injection holes [41] for epoxy encapsulation around the OSA.

Although there are multiple methods for assembling this package, in an embodiment the assembly method is to laminate the interposer [21] to the metal backing [23] as the first step in the assembly process; since lamination may damage the OSA. This embodiment therefore provides for the lateral, side insertion, of the OSA module by sliding the OSA through the open passageway [43] at the side of the package created by the metal backing and interposer [see FIG. 8b]. The OSA [100], surrounded by its mating clip assembly [45], is slid into the side of the package with an appropriate bonding epoxy between the underside of the OSA and the metal backing. The OSA is slid far enough into the package so that the alumina substrate, and its gold traces [5], protrudes slightly into ZONE 1 [35], these traces can then be accessed by the user-defined microchip. Once the OSA has been inserted, the empty spaces around the OSA are filled with an encapsulation epoxy, but do not cover the gold traces on the end of the alumina substrate, nor does the epoxy fill ZONE 1.

The IC package is only partially complete at this point and consists of a standard MT optical ferrule interface [13] with a connector clip [45] at the exterior side of the package. Standard IC package assembly techniques can now be applied to the package without any consideration for the optics inside the package.

Figure 9:
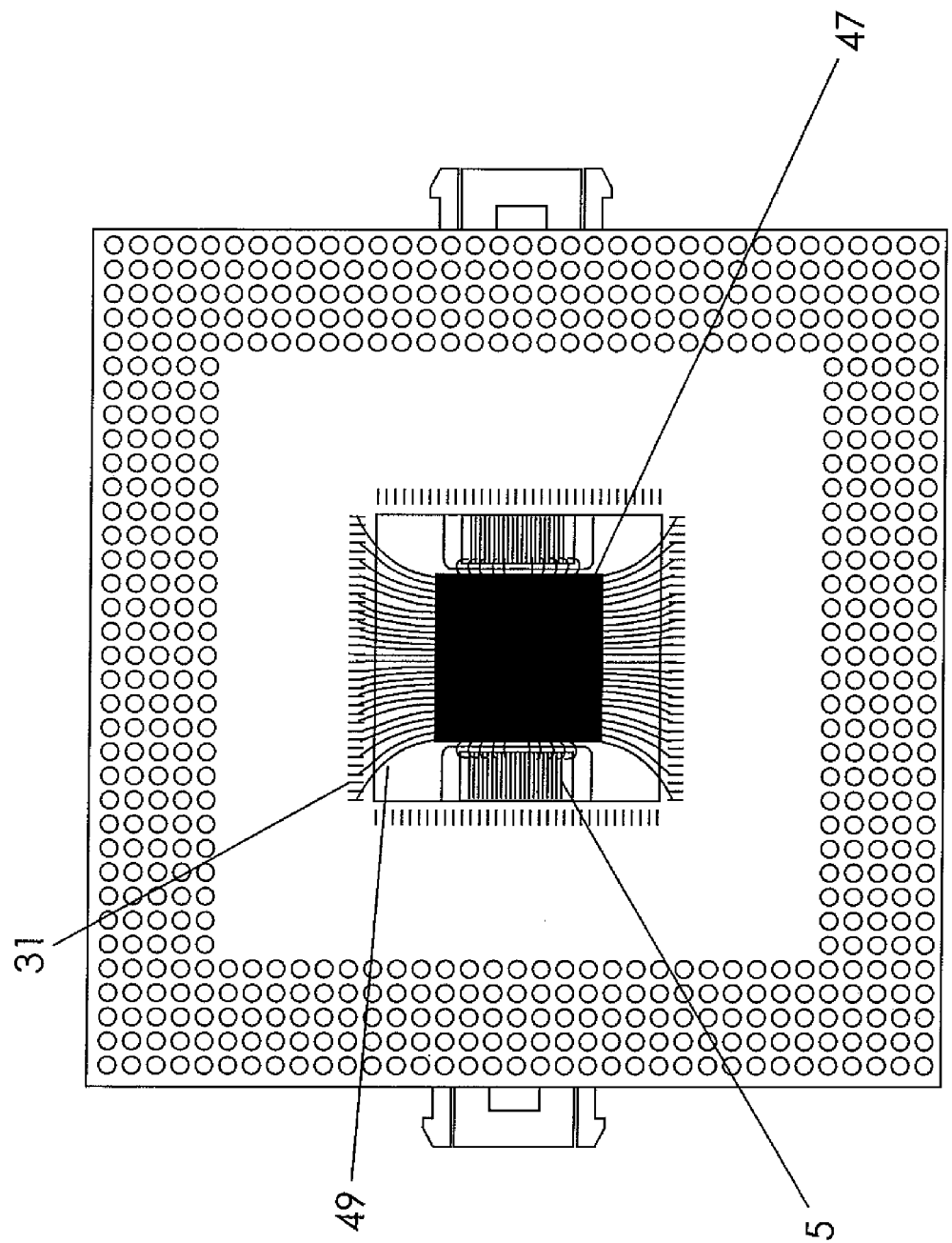
FIG. 9 is a schematic 2-D view of the back of the optically enabled cavity-down BGA package with no glob-top encapsulation showing the wirebonds between the microchip and the fingers on the interposer board and the wirebonds between the OSA and the microchip, in accordance with an embodiment.
Figure 10A:
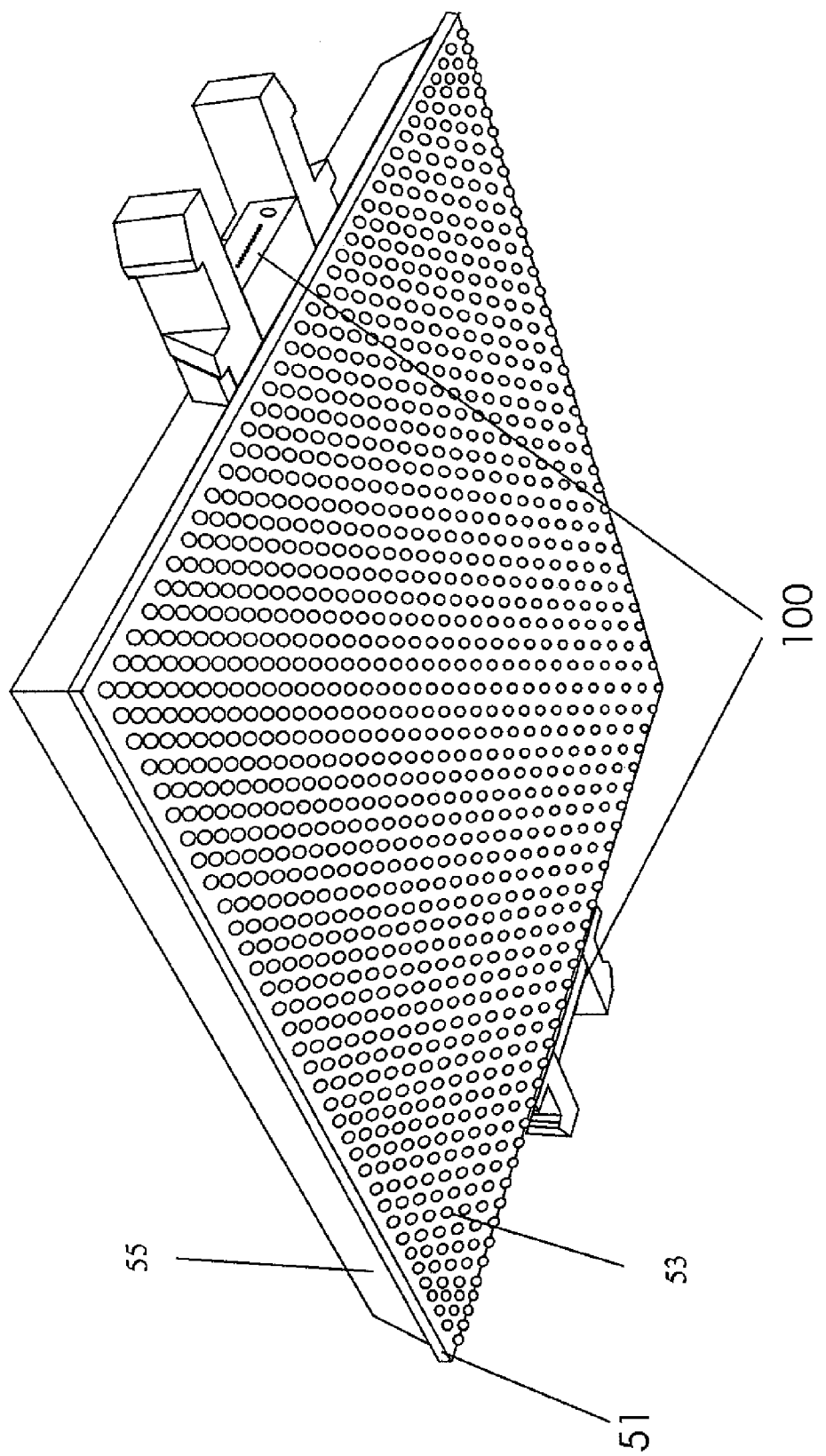
FIG. 10a is a schematic perspective view from the bottom of the complete optically enabled cavity-up FC-BGA package, in accordance with an embodiment.
Figure 10B:
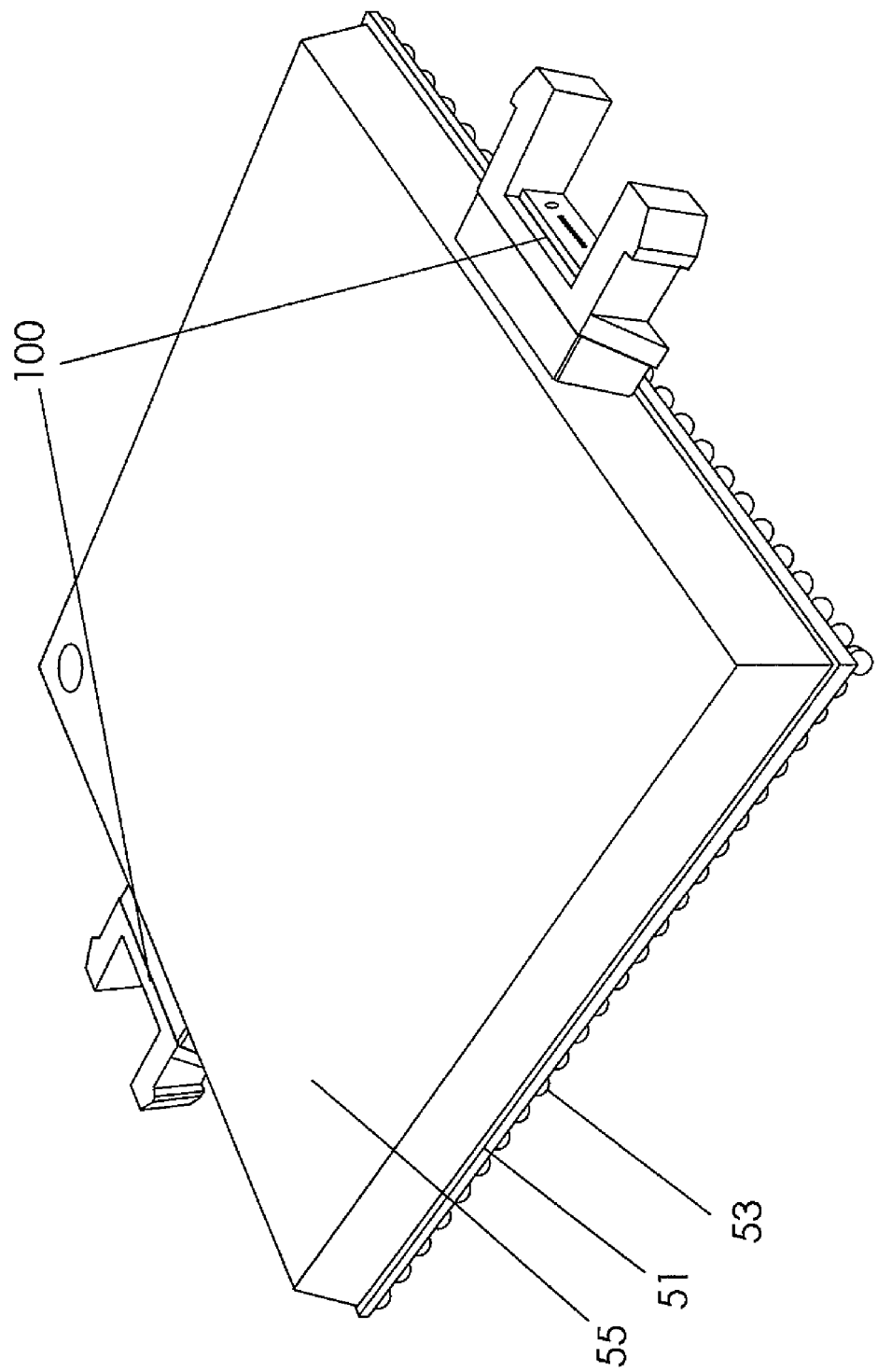
FIG. 10b is a schematic perspective view from the top of the complete optically enabled cavity-down BGA package, in accordance with an embodiment.
Figure 11:
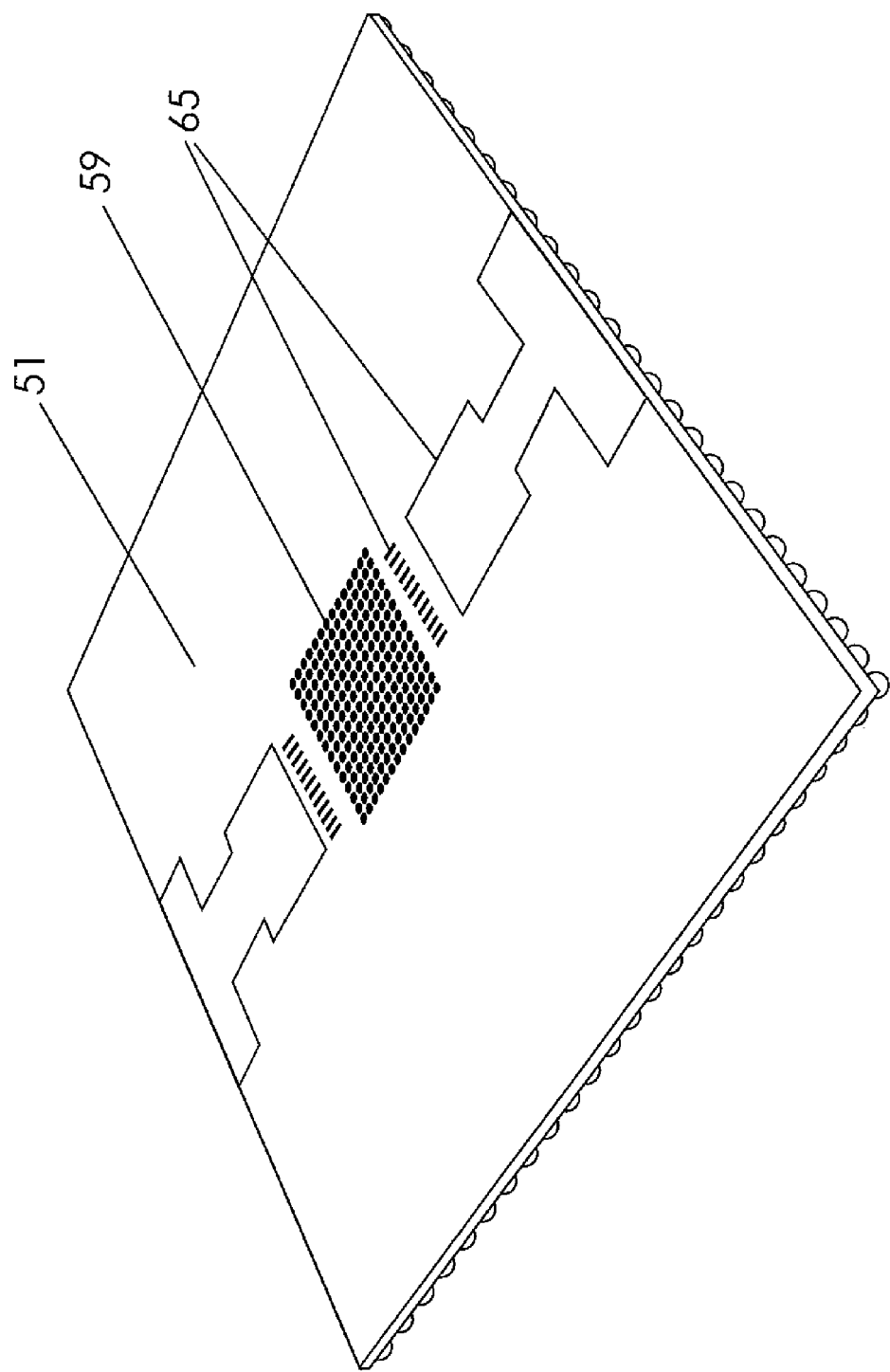
FIG. 11 is a schematic perspective view of the optically enabled cavity-down BGA interposer board with micro-solder ball pads for the microchip and the connection pads and outline for the OSAs, in accordance with an embodiment.

A user-defined microchip [47] is fixed within ZONE 1 using electrically/thermally conductive epoxy and is wirebonded [49] to the gold fingers [31] around the interposer's center opening as well as to the gold trace lines [5] on the alumina substrate—thereby electrically accessing the optical port [see FIG. 9]. A typical step in the assembly of this type of IC package is to next make a small dam of epoxy around the inner cavity and then fill the entire cavity of ZONE 1 in with epoxy [25] to completely cover the microchip and wirebonds which results in a slightly raised, hard, flat surface of epoxy in the middle of the package.

The final step in the construction of the IC package is the placement of the solder balls onto the array of pads on the interposer board. This can be done using a variety of low-tech or high-tech methods, but essentially the solder balls are reflowed to attach to the interposer. The final optically enabled BGA IC package is then ready to be sent to a PCB assembly house where the package can be mounted on a PCB using standard means.

Optically Enabled Cavity-Up Flip-Chip BGA IC Package. The optically enabled cavity-up flip-chip (FC) BGA IC package (FC-BGA) [see FIGS. 10a, 10b, 11 and 12] allows for very high pin-out density and pin count as well as higher data rates because it relies on the method of controlled collapse chip connects (C4) on the user-defined microchip. C4 is effectively a micro-solder ball attach method between the user-defined microchip and the interposer board.

One version of an optically enabled FC-BGA package basically consists of the following sub-parts, although optional heat-dissipation components such as a plate can also be added:
 a. An interposer board [51] (to route signals between the microchip and the external world)
 b. A user-defined microchip [61] that is controlled-collapse chip connected (C4) using micro-solder balls (with an underfill)
 c. Mold or encapsulation [55] for creating the housing over the microchip (this also may include some amount of glob-top encapsulation epoxy)
 d. Solder balls [53] (typically 0.8-mm diameter pitched at 1.27-mm in both directions of a regular matrix array)
 e. One or more optical sub-assemblies (OSA) [100] using either wirebonding or flip-chipping to attach to the interposer board The interposer board [51] is a rigid, square platform onto which all the subcomponents of the package are placed. It can be made from a ceramic or an organic substrate (like FR-4 or polyimide), it can have multiple layers with power planes, ground planes, through-vias and signal lines that route between the microchip and the solder pads. The cavity-up flip-chip aspect of the package implies that the solder pads used to connect between the package and the PCB are on the opposite side from where the microchip is placed. The solder ball array [53] also may cover one entire side of the interposer (for example: a 32-row by 32-column matrix for a total of 1024 solder balls). The solder pad array [59] as shown in the middle of the interposer board [51] onto which the microchip is placed has pads that are matched in size and pitch to the connection points on the microchip and are therefore much smaller and tighter pitch [see FIG. 11]. The microchip (or entire wafer) is patterned with micro-solder balls (such as indium metal) and then aligned and reflowed to the solder pad array [59] in the middle of the interposer [see FIG. 12]. The flip-chipped microchip [61] is then underfilled with an epoxy resin [63] to help stabilize the attachment for CTE mismatches and block humidity.

Figure 12:
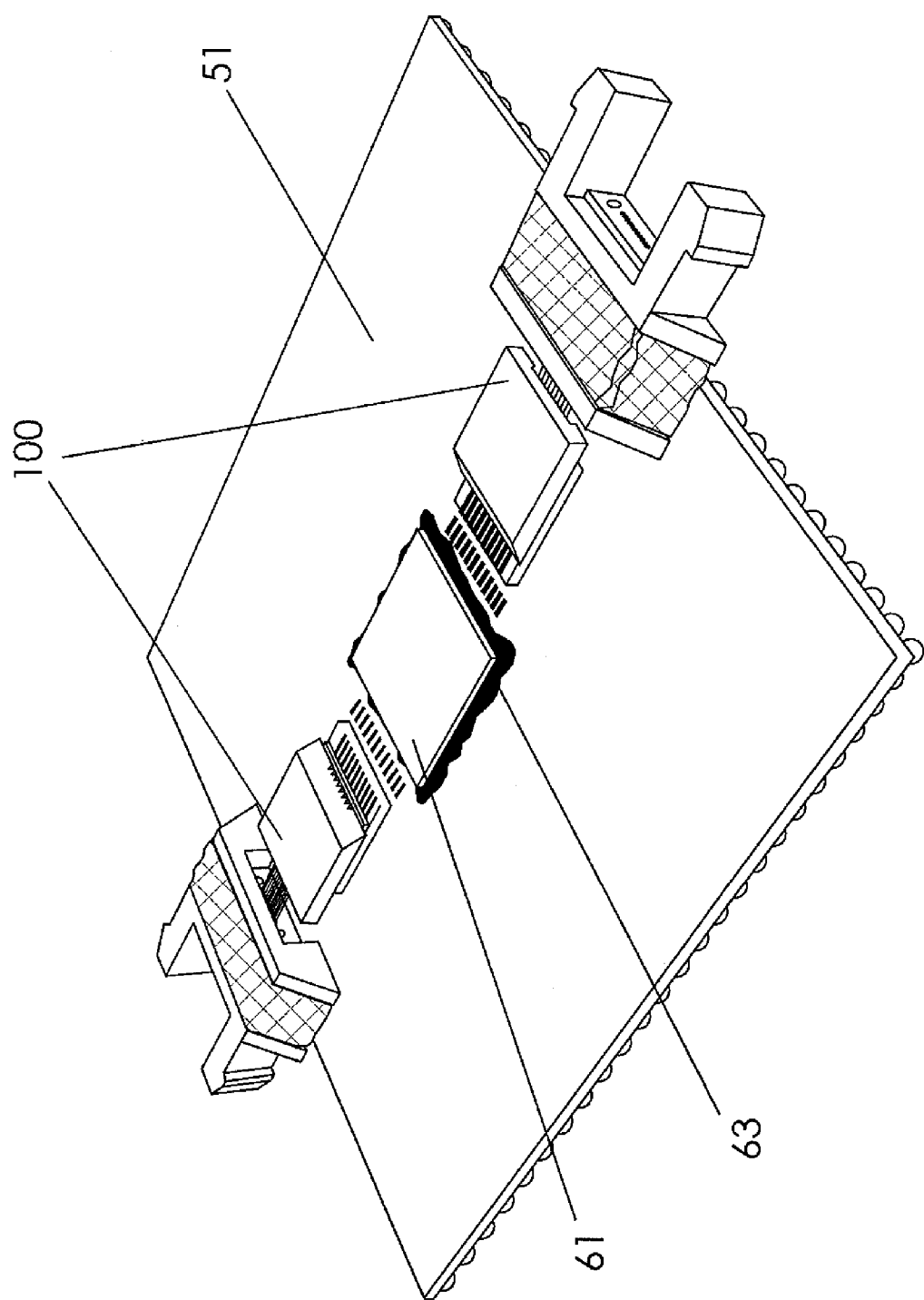
FIG. 12 is a schematic perspective view of the OSAs and microchip with underfill placed on the interposer board, in accordance with an embodiment.
Figure 13:
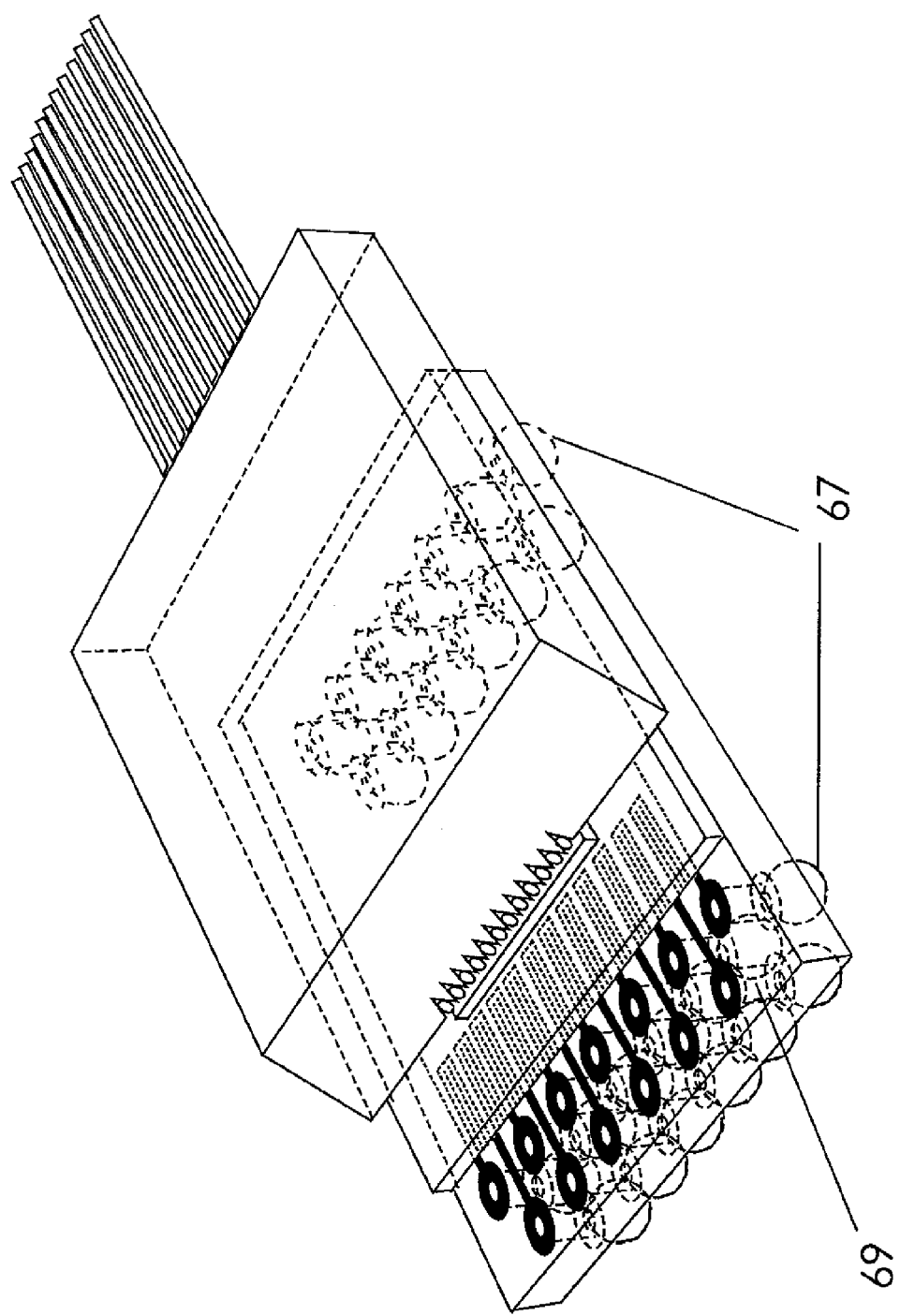
FIG. 13 is a schematic perspective view of a possible version for a flip-chipped OSA module showing solder-balls on the back side of the alumina substrate in accordance with an embodiment.

A similar type of optical sub-assembly (OSA) [1009] as above [see FIG. 12] is then placed on the interposer board and aligned to the matching OSA electrical connection points [65] on the interposer. The signals travel only a few millimeters between the flip-chipped microchip and the OSA never leaving the interposer board. Although the OSA described above implies the use of wirebonds (not shown) between the interposer and the OSA, a method can also be envisioned that uses a similar C4 flip-chip method [67] under the alumina substrate of the OSA [see FIG. 13]—given that alumina substrates can also be constructed using vias [69].

Figure 14:
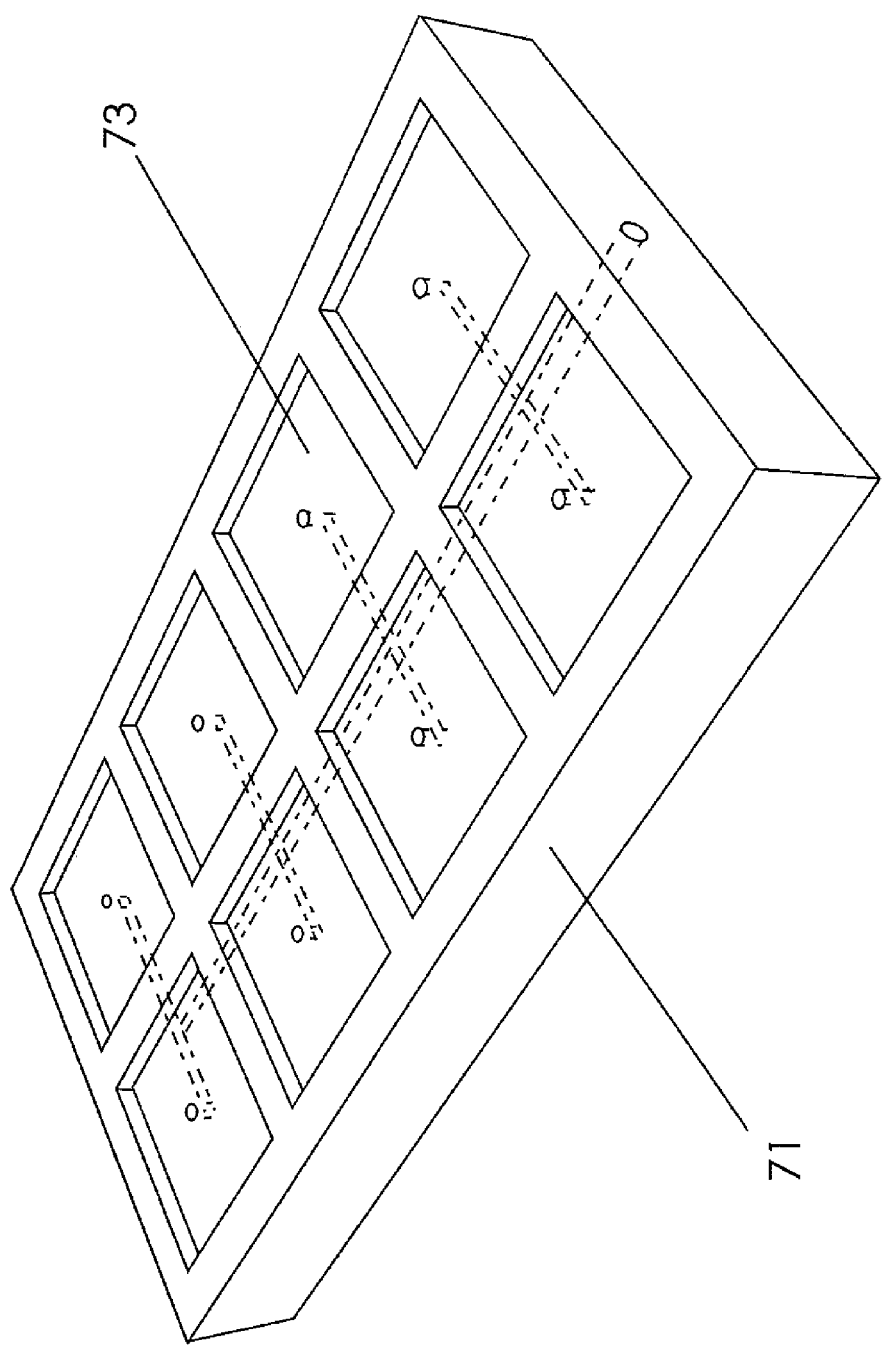
FIG. 14 is a schematic perspective view of a typical molding die showing cavities within the die according to prior art.

When molding a standard FC-BGA, a stainless-steel die [71] with machined cavities [73] of the "negative-image" of the final casting is used [see FIG. 14]. When a FC-BGA interposer is placed in such a mold, a molding compound, such as an epoxy resin, is used to fill the mold to create a large, solid rectangular form fully encapsulating the microchip and wirebonds [see FIG. 6].

Figure 15:
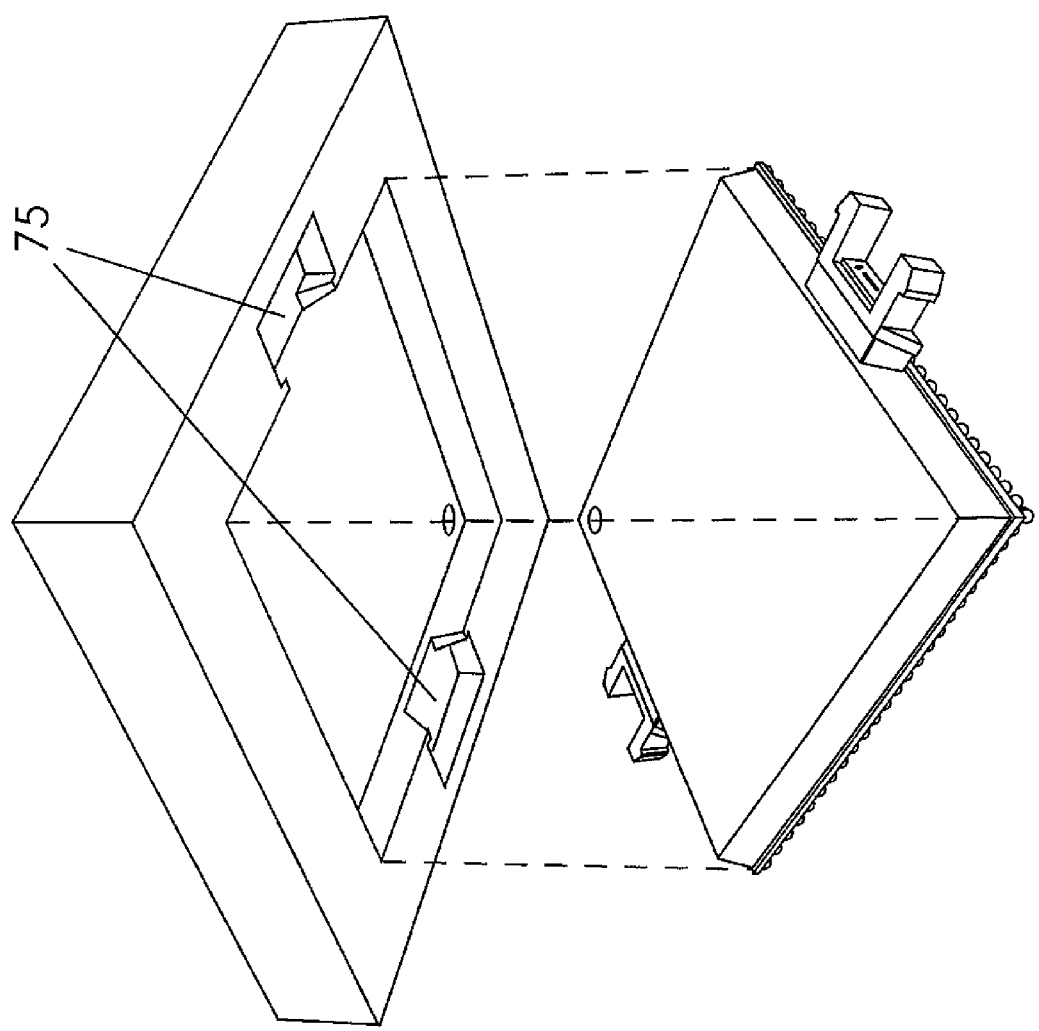
FIG. 15 is a schematic perspective view of a modified molding die oriented over a FC-BGA interposer after molding and showing the additional cavities required for the OSAs, in accordance with an embodiment.

In the case of an optically enabled FC-BGA package, the molding die must allow the molding compound to form over the interposer without covering the optical interfaces of the OSA. Therefore, the die must include additional cavities [75] to accept the optical interface of the OSA [see FIG. 15].

Figure 16:
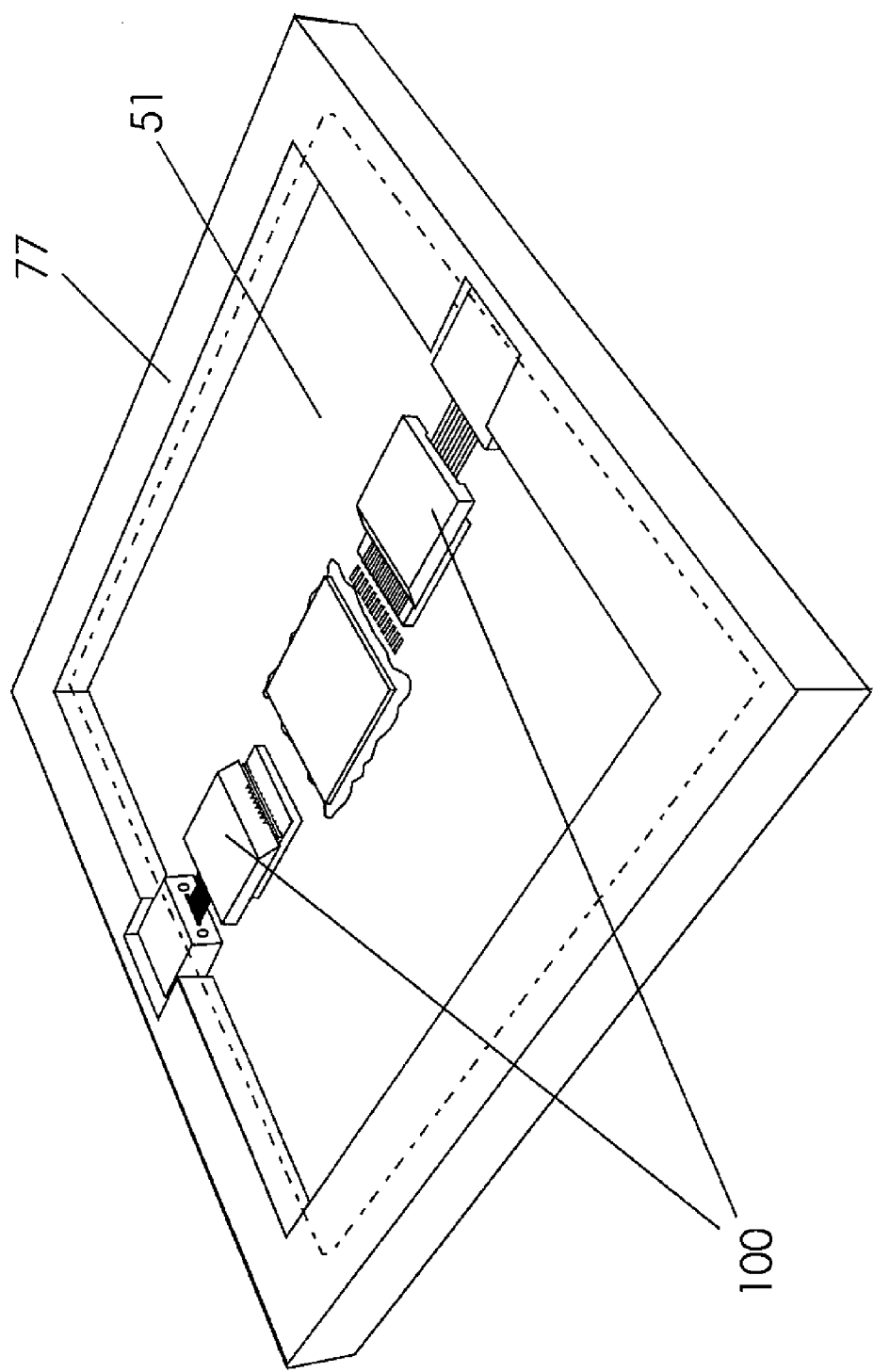
FIG. 16 is a schematic perspective view of one possible implementation of a frame to precisely position OSAs on an FC-BGA interposer board prior to molding, in accordance with an embodiment.

Prior to molding, the OSA must be physically attached to the interposer and electrically connected. In the case where more than one (1) OSA is placed on the interposer, the OSAs must be well aligned with respect to the die's cavity. The OSA could either be placed with high accuracy using precision pick-and-place techniques or positioned using a well toleranced frame [77] that holds the MT-side of the OSAs in the correct positions [see FIG. 16]. The gold fingers of the OSAs can then be wirebonded to the interposer.

Figure 17:
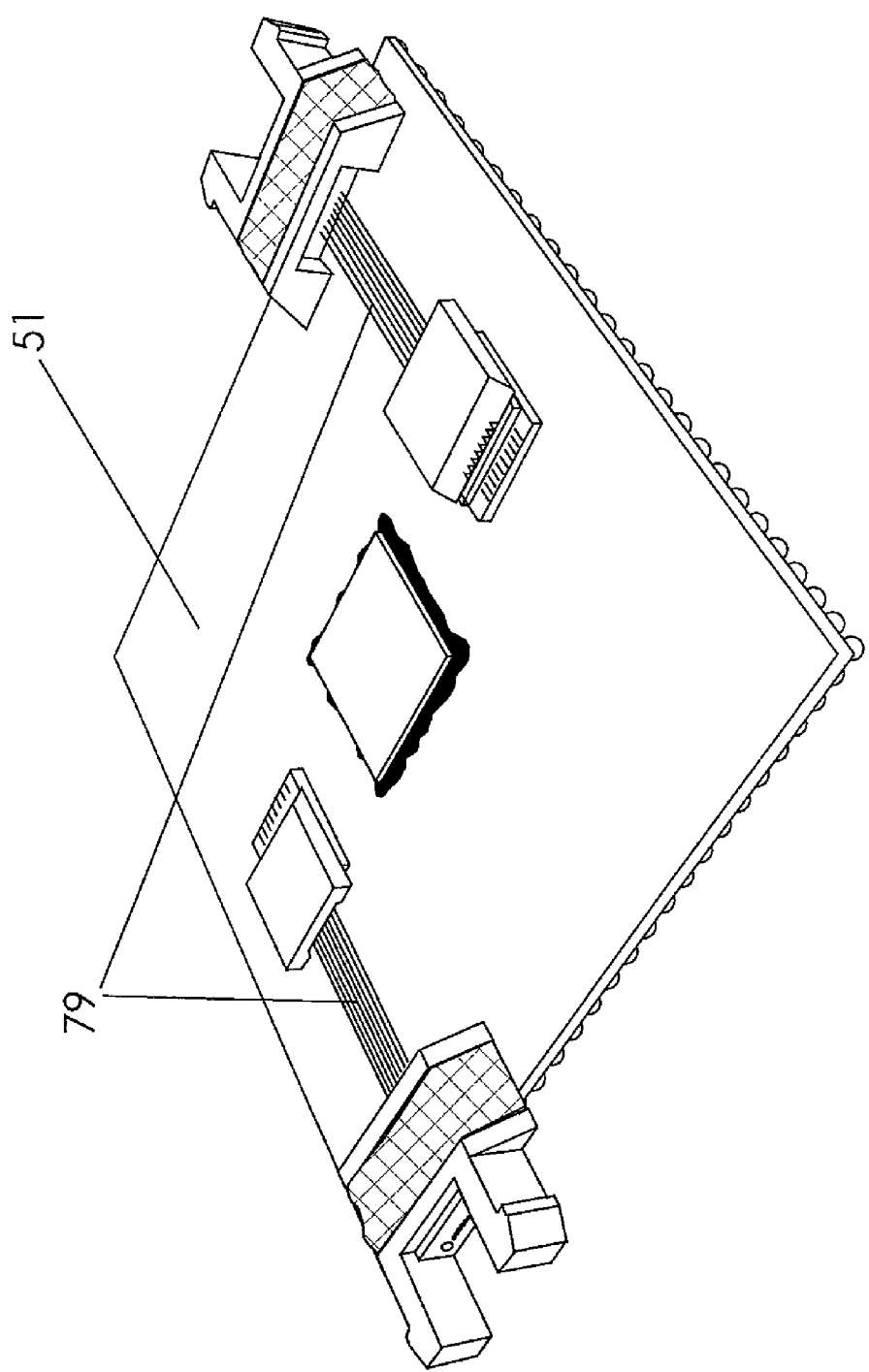
FIG. 17 is a schematic perspective view of a flip-chipped OSA with longer ribbon fiber for positional flexibility positioned on an FC-BGA interposer board, in accordance with an embodiment.

For a flip-chip version of the OSA, the OSA's position on the interposer is fixed by the flip-chip points on the interposer. Therefore, the MT side of the OSA may not be aligned to the die. One solution is to provide for greater positional flexibility of the MT ferrule by using slightly longer optical fiber ribbons [79] between the MT and the VCSEL/PD device so that small lateral shifts of the MT connector could be tolerated when the molding die is positioned over the interposer [see FIG. 17].

Figure 18:
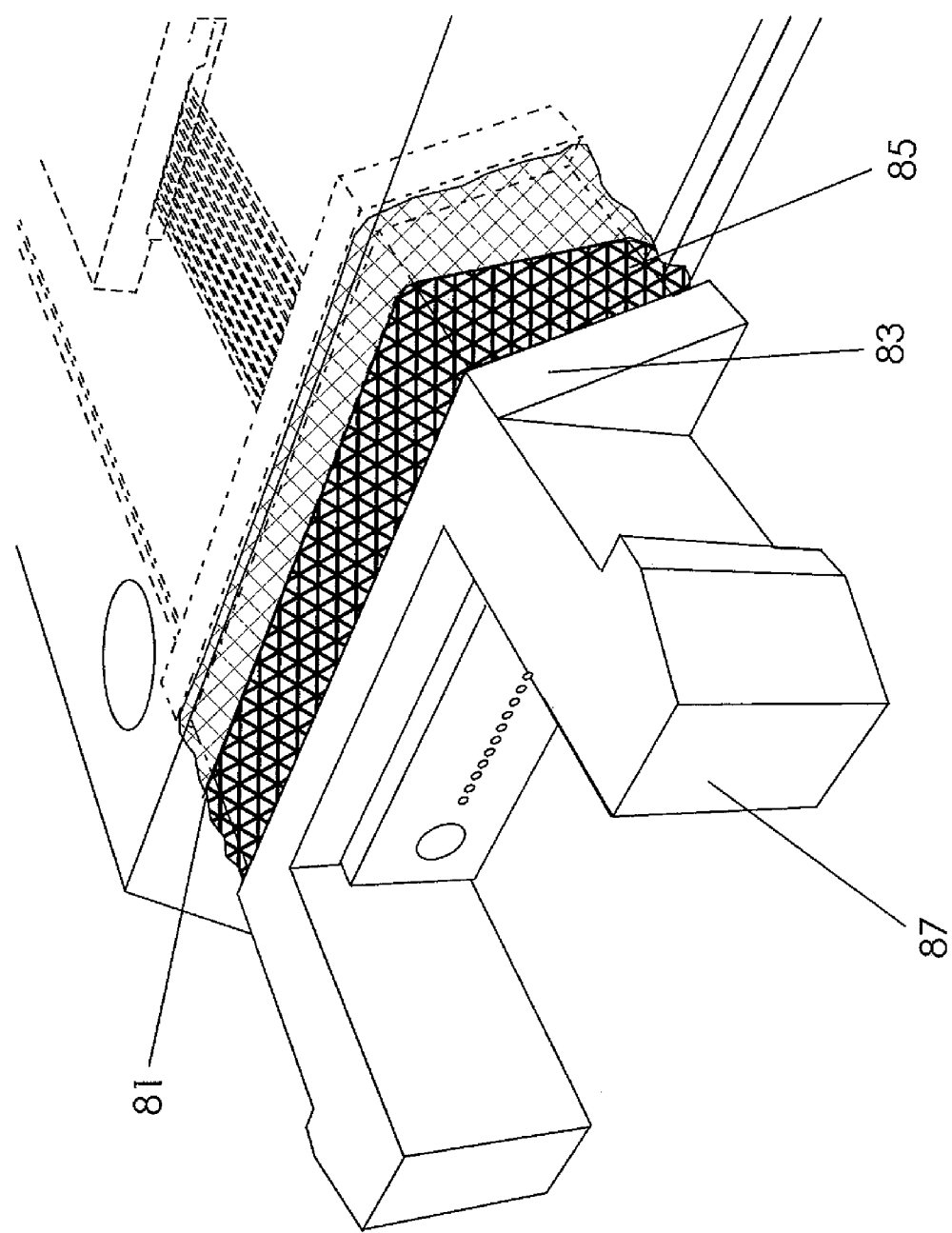
FIG. 18 is a schematic perspective view of a pre-form and a gasket surrounding the MT ferrule and all positioned on the FC-BGA interposer used to seal the seams between the molding die and the MT ferrule during molding, in accordance with an embodiment.

An additional issue to consider in the molding process is the possibility of a flash of molding compound at the seam [81] (a squirting out of epoxy though the seam) where the mold meets the MT ferrule. This may require a specialized pre-form [83] and/or gasket [85]. This pre-form over the MT ferrule can also serve as part of the mating clip [87] required for the optical patch cable [see FIG. 18]. Alternatively, the gasket could be substituted for a small layer of epoxy (or silicon or similar substance) that would harden sealing the MT Ferrule pre-form to the mold. The mold could then be filled with the molding compound without any flash. Of course, in a more integrate approach the MT ferrule, the MT Ferrule pre-form and the mating clip would all be a monolithic plastic part that is produced as a single piece—this would lower the number of assembly steps.

The final step after molding the housing over the interposer is to have the other side populated with solder balls on each solder pad. This can be done using a variety of low-tech or high-tech methods, but essentially the solder balls are reflowed to attach to the interposer. The final optically enabled FC-BGA IC package is then ready to be sent to a PCB assembly house where the package can be mounted on a PCB using standard means.

FIGS. 19-24 describe Internal Optical Mating according to various embodiments.

In one embodiment, a mating clip is proposed that incorporates mechanical features that mate an optical connector and optical fiber cable assembly with the side optical port of a hybrid optically enabled integrated circuit (IC) package. In an embodiment, the mating clip can be a spring-steel mating clip. Other materials are also contemplated such as different kinds of plastics and metals.

Figure 19:
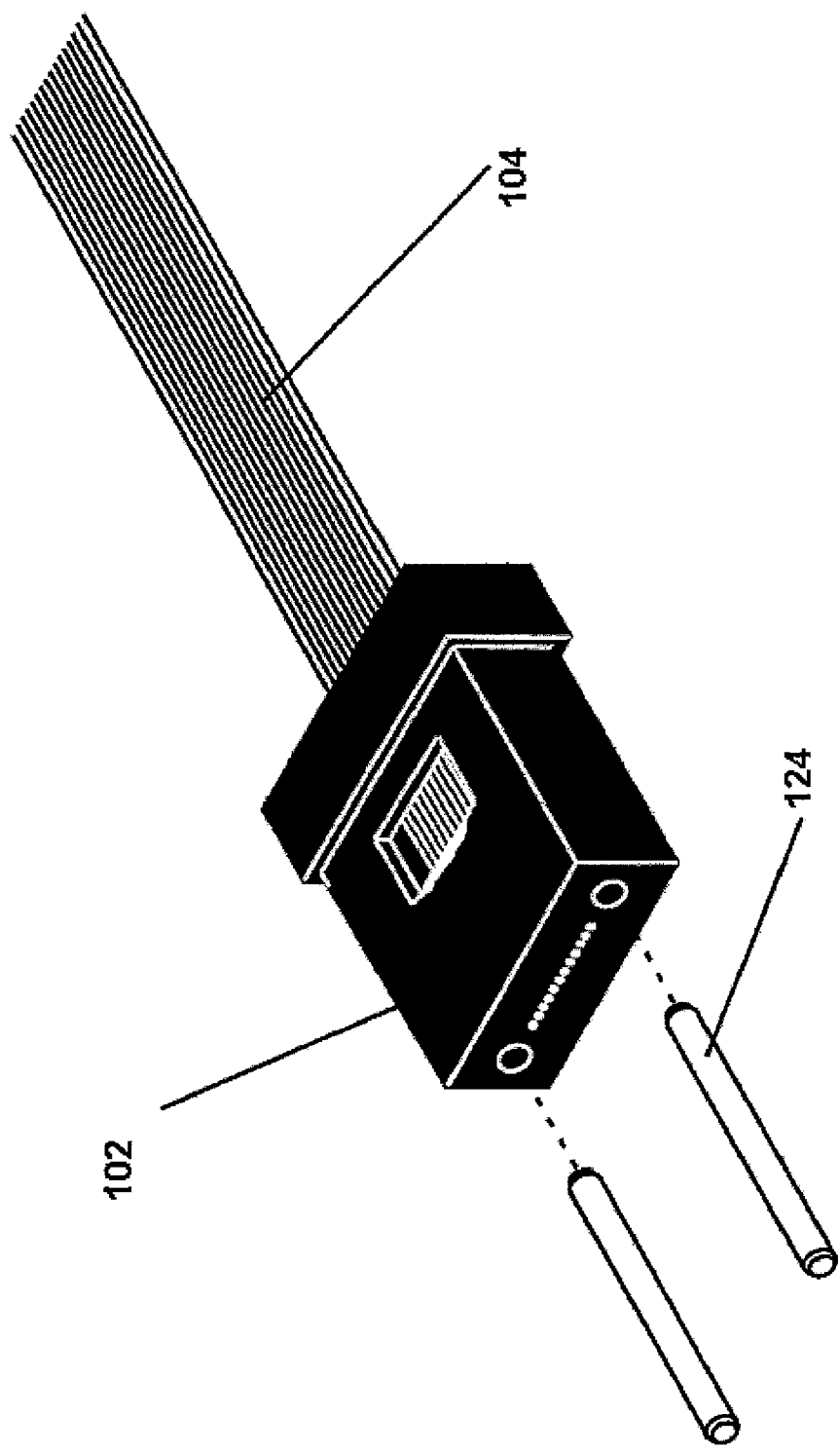
FIG. 19 is a schematic perspective view of a 1×12 MT ferrule and optical fiber ribbon cable assembly, according to prior art.

As shown in FIG. 19 labeled prior art, the optical connector is a 1×12 MT ferrule [102] for use with parallel optical ribbon fiber [104] cable.

Figure 20:
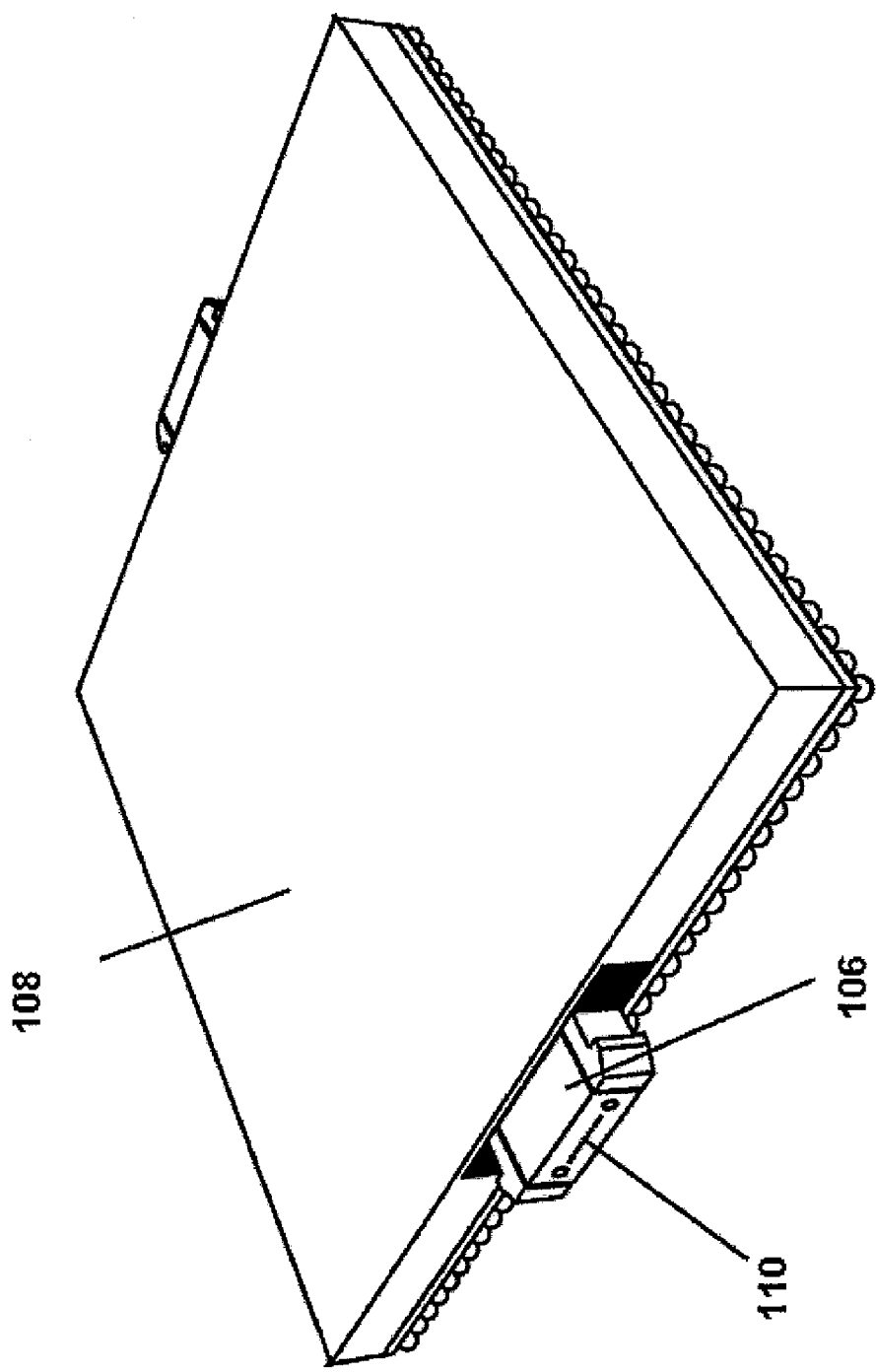
FIG. 20 is a schematic perspective view of a Hybrid Optical IC Package in accordance with an embodiment.

As shown in FIG. 20, the optical port [106] on the IC package [108] is similar to the MT ferrule, but in addition to the optical interface [110], the optical port of the IC package has mechanical features that allow a mating clip to grasp and hold while applying a mating force to the back of the MT ferrule and cable assembly.

Figure 21:
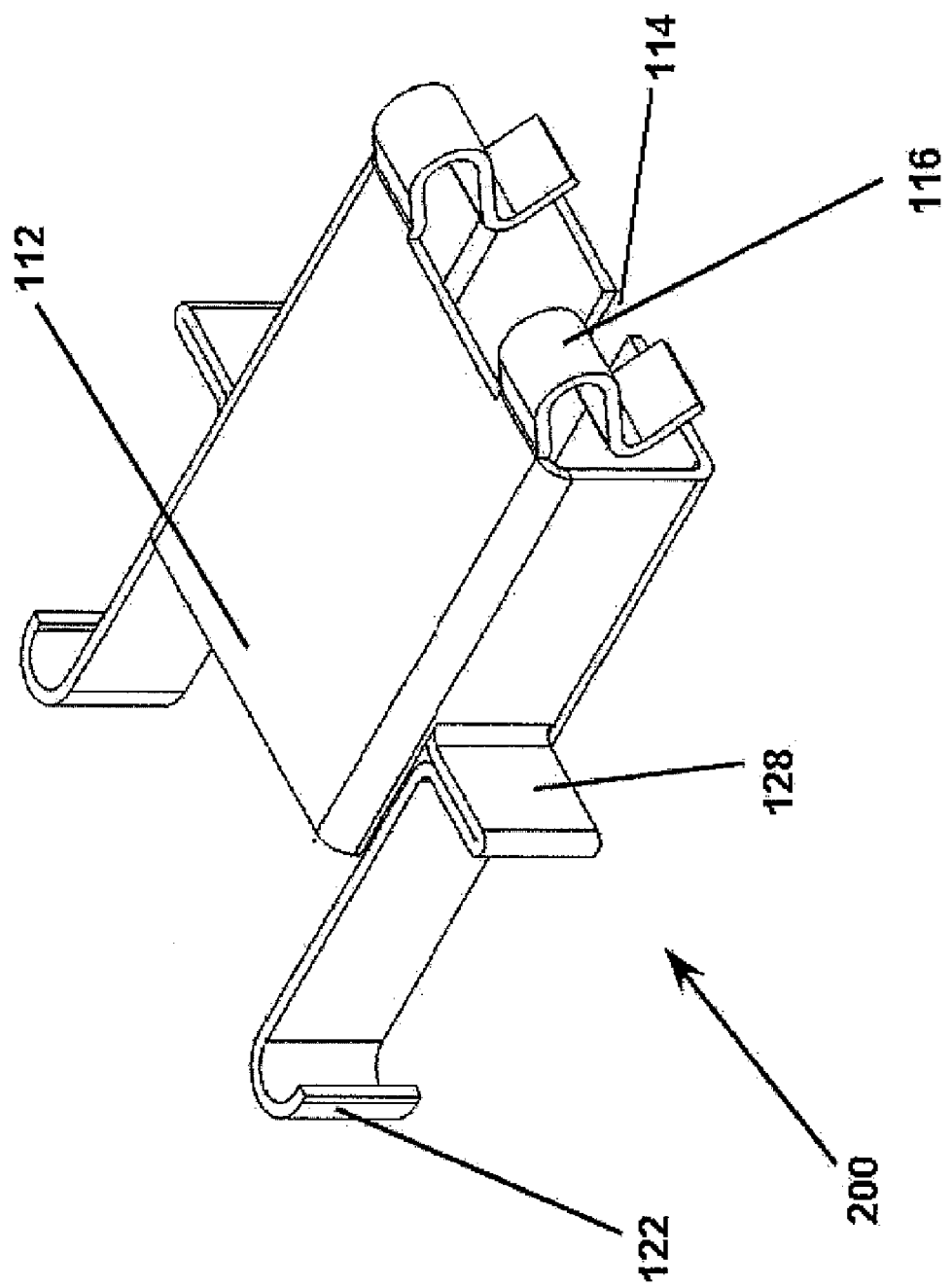
FIG. 21 is a perspective view of a mating clip used to hold a 1×12 MT ferrule into a hybrid optical IC package in accordance with an embodiment.

As shown in FIG. 21, the mating clip [200] is designed to substantially surround the MT ferrule and partially surround the front portion the optical interface between the MT ferrule and the optical port of the IC package. This covering feature [112] protects the "seam" or "very small gap" [114] that exists between the optical interface [110] and the MT ferrule [102] from the infiltration of dust or debris. An additional barrier (not shown), in the form of a gasket, an o-ring, a taped seal or even a velvet-pad glued to the inner surface of the MT clip, could also be positioned over the optical interface to help seal the interface—this barrier could be either a separate part or integral to the mating clip.

The S-shaped curved features [116] at the back of the mating clip are used in the spring-steel design shown in FIG. 21. These features deflect backwards to produce a mating force on the back of the MT ferrule when it is pushed up against the optical port of the IC package. The design of the S-shaped curved features [116] must allow for variation in lengths of the MT ferrule as well as the IC package's optical port. Polishing procedures on the optical facets of either of the two interfaces can result in length differences from part to part and the spring feature must account for these tolerances while still applying a mating force.

Figure 22:
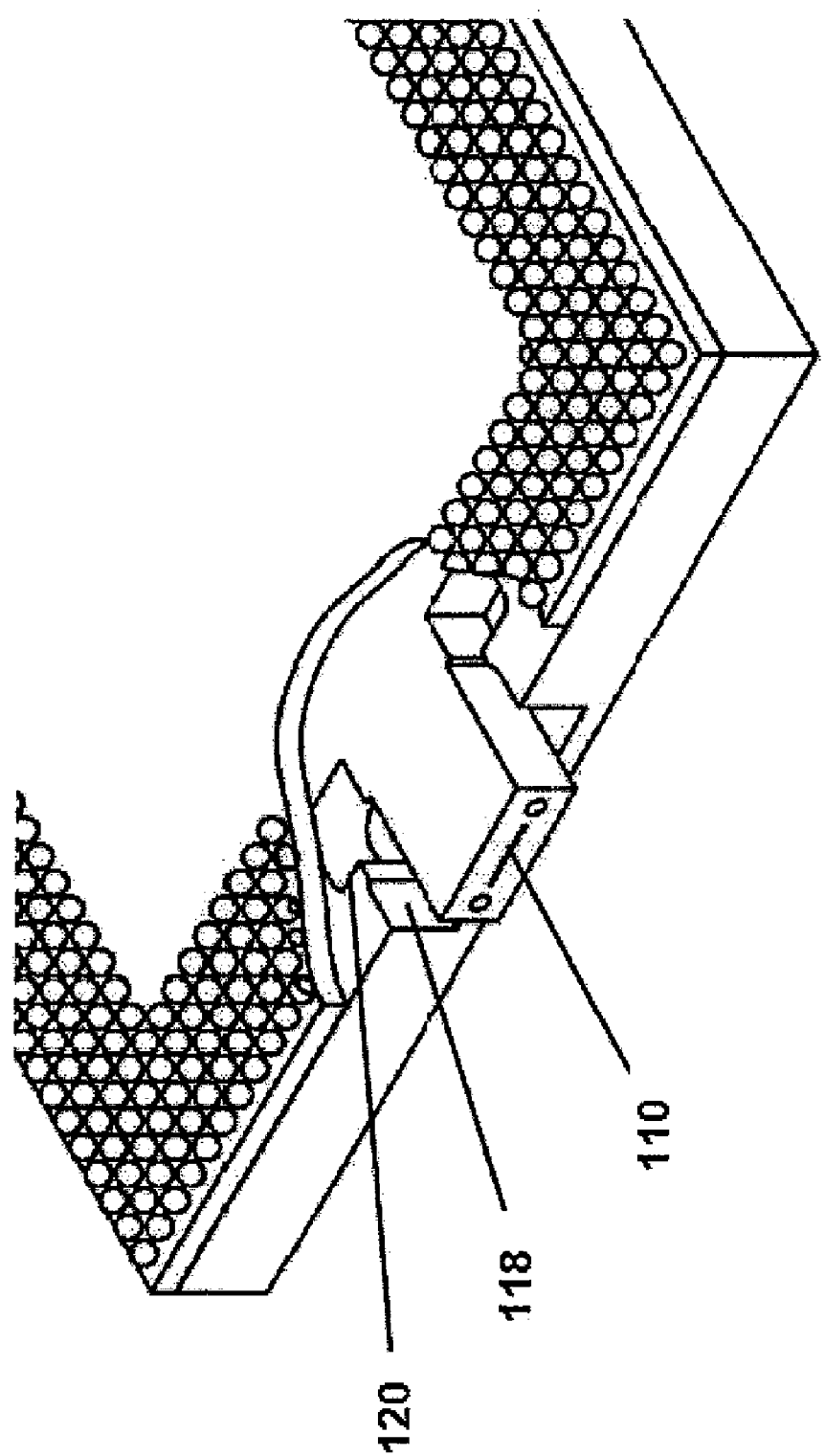
FIG. 22 is a schematic perspective view of a cavity-down IC package with a cut-away view of its optical port as shown from the bottom of the package in accordance with an embodiment.

Although there are numerous mechanical designs possible for the interior features of the IC package's optical port, FIG. 22 shows a cut-away view of an optical port of an IC package that has solid, permanent, non-moving walls [118] and notches [120] within the optical port. The IC package in FIG. 22 is shown up-side-down with respect to the normal way it would be solder connected to a printed circuit board. Note that moving parts on the IC package (bendable clips or springs) would not only be very atypical of standard IC packaging, it would also be a source of possible mechanical failure—which might render the entire IC package useless.

Figure 23:
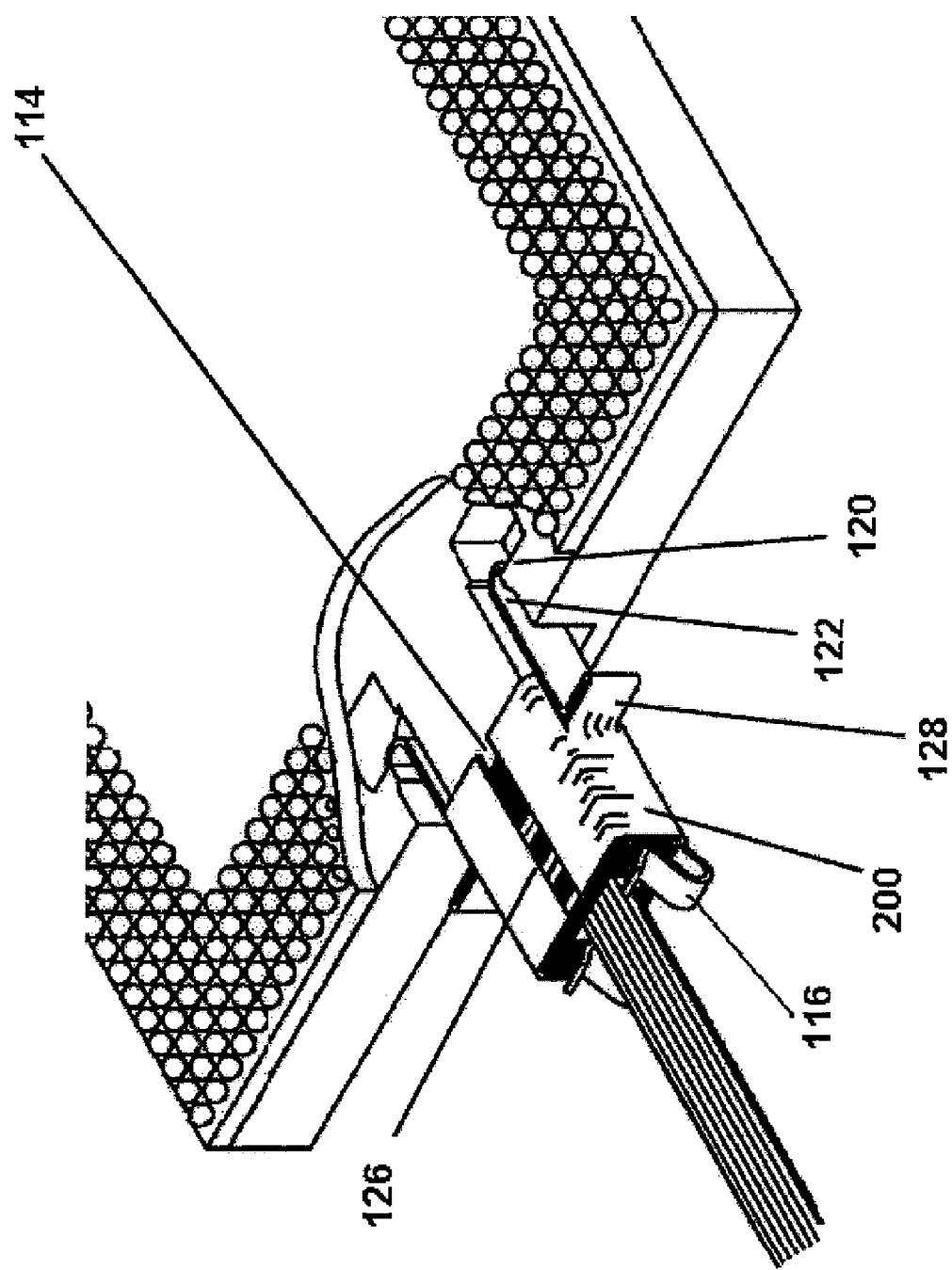
FIG. 23 is a schematic perspective view of a cavity-down IC package with a cut-away view of its optical port and a mating clip and MT ferrule with optical fiber connected into the optical port as shown from the bottom of the package, in accordance with an embodiment.

The mating clip [200], as shown in FIG. 23, grasps over the notches [120] in the IC package's optical port using its protruding front hooks [122], these hooks deflect inwards slightly and then spring back into place once they are pushed slightly ahead of the notches.

The mating clip [200] has been designed with other features that simplify the task of producing a mating force between the MT ferrule and the optical port. Once the IC package has been soldered to the PCB, the MT ferrule (with its ribbon fiber [104]) is mated to the optical port using the dowel pins [124], as shown in FIG. 19, and is gently slid forward to mate it to the optical port's interface. Since the mating clip [200] is opened on the bottom side [126], it can be slotted over the optical fiber ribbon [104] and pushed up to and over the MT ferrule [102] lining-up the front hooks [122] with the walls [118] and notches [120] (as shown in FIG. 22) in the IC package's optical port. The wing features [128] on the sides of the mating clip [200] allow the mating clip to be easily pushed forward by hand (without pushing on the S-shaped features [116] at the back that must bend backwards). The mating clip [200] is then pushed into the optical port until the hooks [122] have grasped the internal notches [120] of the IC package and the S-shaped springs are exerting a force on the back of the MT ferrule.

Figure 24:
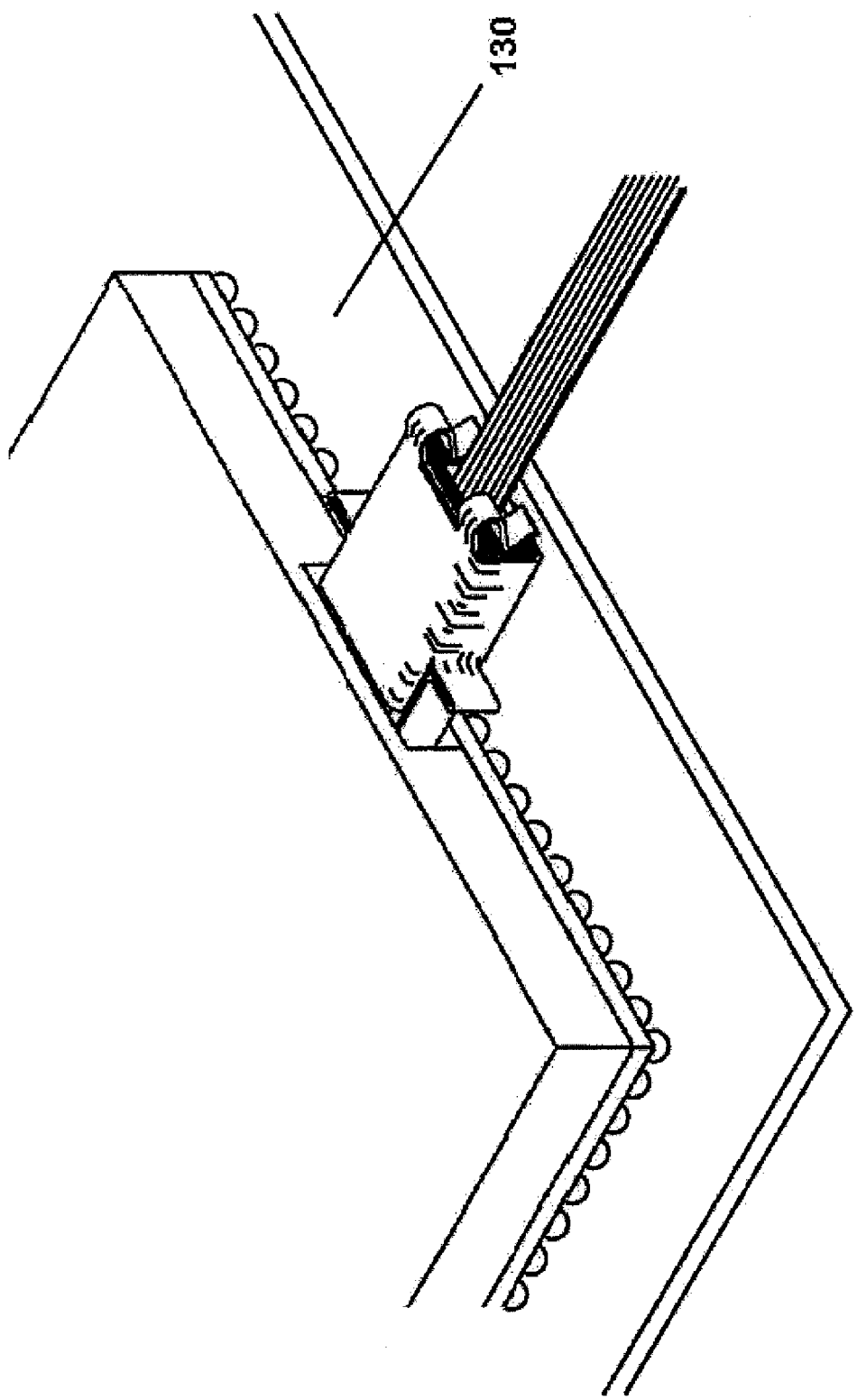
FIG. 24 is a schematic perspective view of a cavity-down IC package with an optical port and a mating clip and MT ferrule and optical fiber connected into the optical port as shown from the top of the package, where the package has been mounted to a printed circuit board, in accordance with an embodiment.

The final assembly of the MT ferrule and cable, the mating clip and the optical IC package, where the IC package is the right-side-up and has been mounted on a printed circuit board [130], is shown in FIG. 24. The mechanical features, the walls and the notches are all internal to the housing of the IC package. The features within the IC package can all be made using a variety of IC packaging manufacturing procedures such as a machining process, an injection molding process, or a stamping process.

An additional aspect of the mating procedure is the protection of the optical port on the IC package from physical damage. Since the IC package would typically be permanently soldered to the PCB, damage during PCB assembly to the front facet of the optical port is undesirable—a scratch on the front facet could result in a decreased coupling of optical power. To help avoid damage to the optical port's front facet, alignment dowel pins [124] (as shown in FIG. 19) can be fixed in position inside the optical port of the IC package during its initial manufacturing. These dowel pins are mainly used to align the MT ferrule, but they can act as protective barriers when the MT ferrule and cable are inserted—it is much more difficult to scratch the surface of the optical port with the two dowel pins in the way. Secondarily, it may be more desirable for the optical ports to protrude from the sides of the IC package instead of being recessed within a cavity inside the IC package. Although contrary to typical strategies for most optical modules (example: SFP, XFP, SNAP-12 transceiver modules) where the optical facets are within a cavity inside the housing, an optical facet that protrudes the side of the IC package greatly improves the ability to clean the optical port especially once the IC package has been soldered to the PCB. This also facilitates the removal of any protective cover or rubber boot over the optical ports that must be removed as part of optically connecting the MT ferrule.

FIGS. 25 to 30 describe External Optical Mating according to various embodiments.

An alternative optical coupling mechanism for a hybrid optically enabled IC package is based on the above description of the optically enabled integrated circuit package and on the optical sub-assembly (OSA) and IC package styles outlined in: U.S. patent application Ser. No. 10/625,905 dated Jul. 24, 2003 entitled OPTICAL FERRULE by Rolston et al., which is hereby incorporated into this application by reference.

Figure 25:
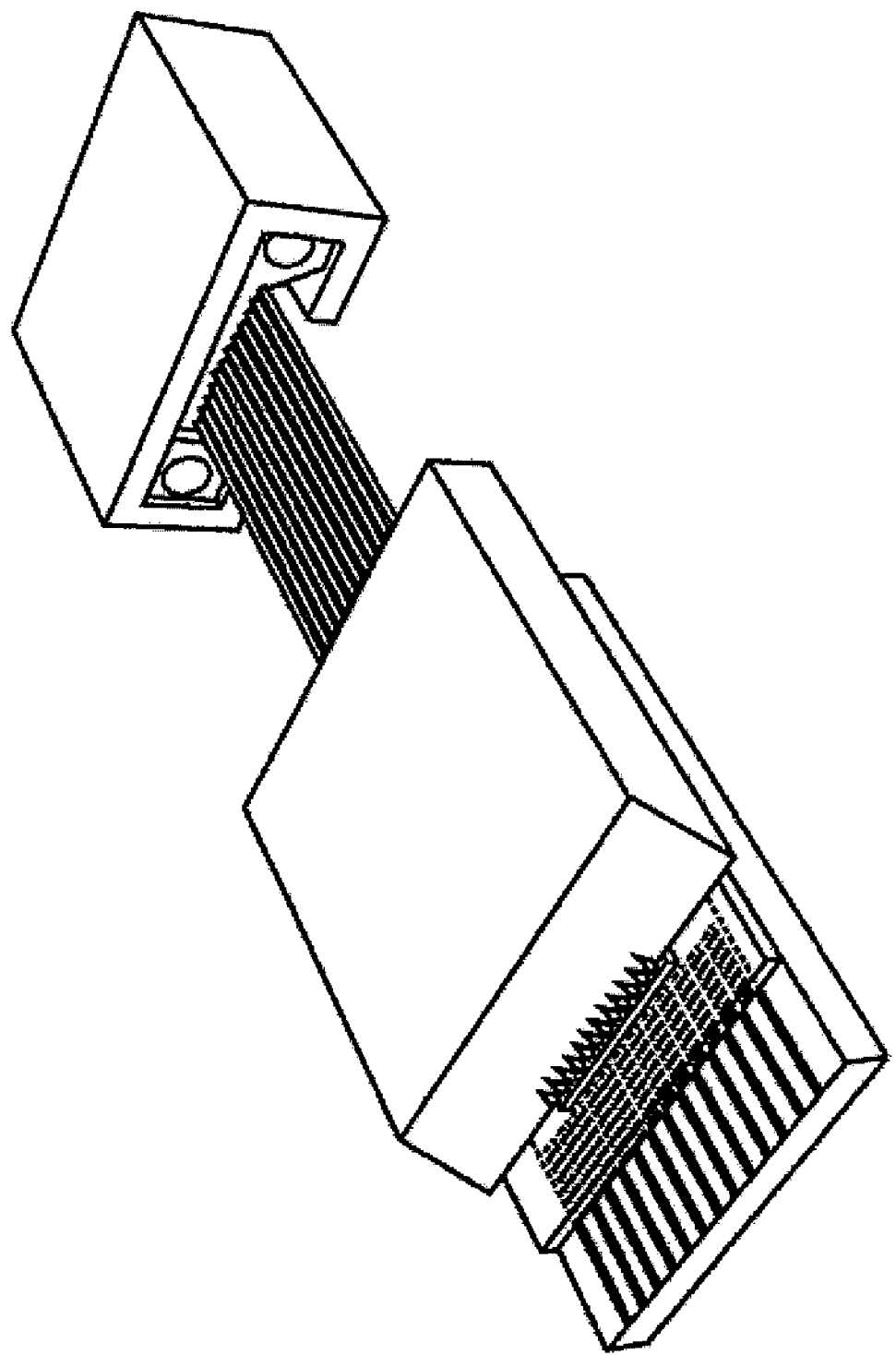
FIG. 25 is a perspective view of an optical sub-assembly with an electrical portion and an optical portion, according to the prior art.

Using the general structure of the OPTICAL FERRULE, as shown in FIG. 25, as well as the various structures suggested hereinabove and in FIGS. 7a to 18, an optical mating technique can be envisioned that relies solely on the optical port of the IC package to accomplish optical mating.

Figure 26:
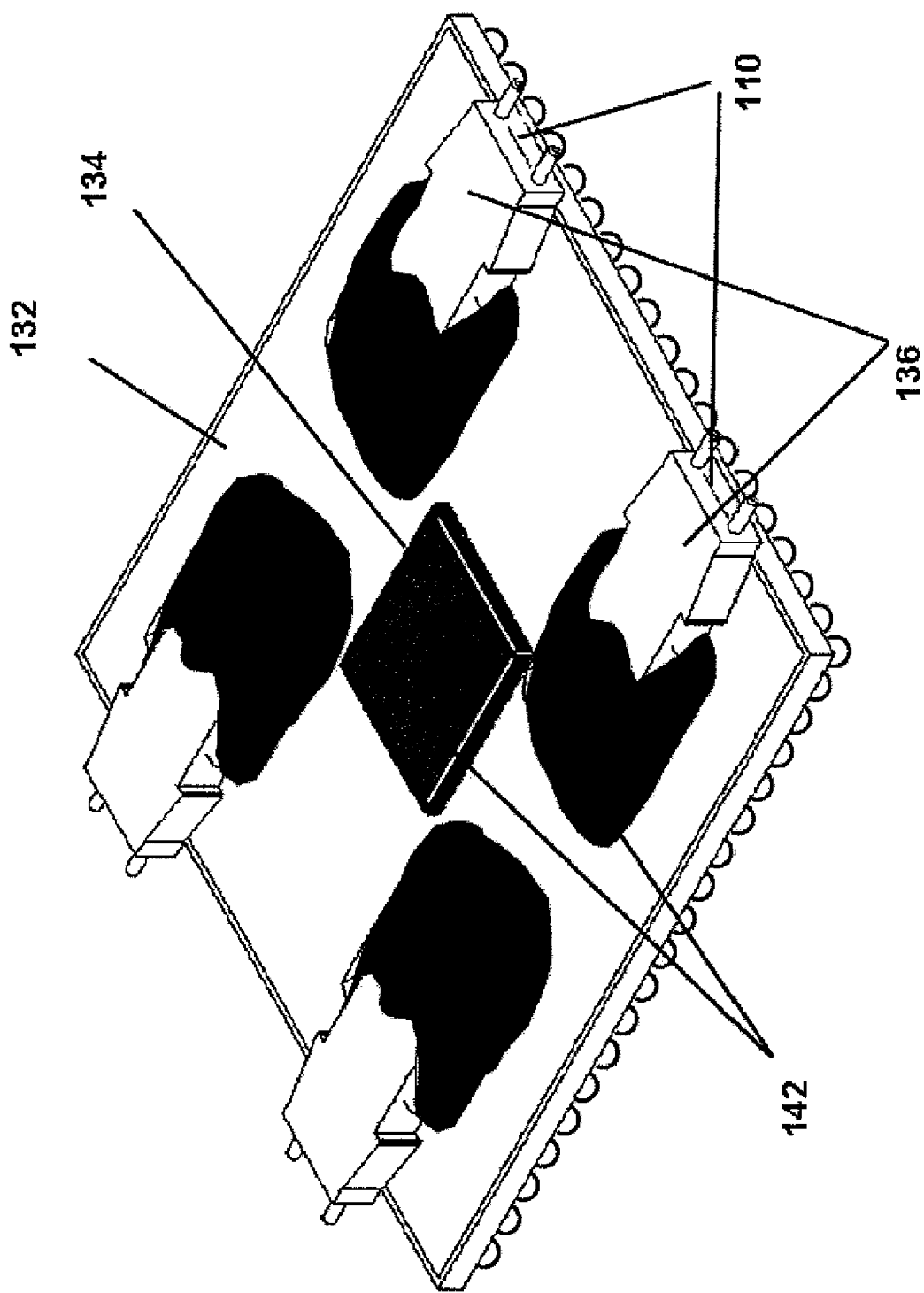
FIG. 26 is a schematic perspective view of a cavity-up IC package with 4 optical ports around the perimeter where a portion of the optical ports have been glob-topped with epoxy resin and the center microchip has been glob-topped with epoxy resin, in accordance with an embodiment.

The particular type of IC package shown in FIG. 26 is a flip-chip, organic substrate [132], cavity-up IC package that can accommodate both a microchip [134] and numerous optical sub-assembly (OSA) modules [136] around the perimeter of the IC package. An adapted OSA module [136] is shown in FIG. 27 which has been modified to include protruding flares [138] on each side to help with the clipping mechanism.

Figure 27:
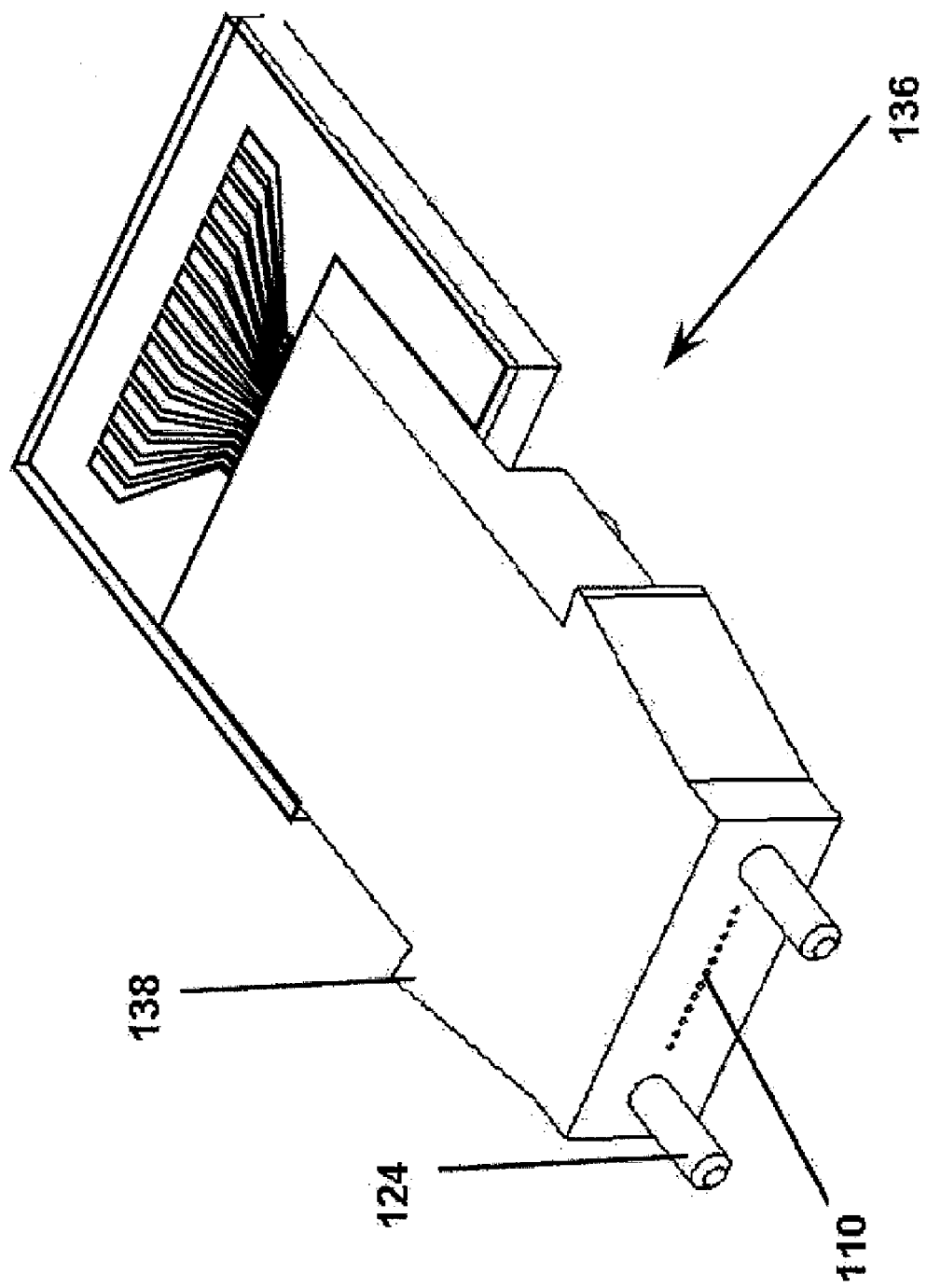
FIG. 27 is a perspective view of an optical sub-assembly that has been augmented to include side-flares on the optical port portion for use with external optical mating techniques, in accordance with an embodiment.

The general structure of the OSA shown in FIG. 27 is very similar to those discussed in the references above, except for the additional concept of incorporating optical mating features [138] into the OSA module itself—and NOT relying on features over the body of the IC package to perform the mating.

In FIG. 26, both the OSA modules [136] and the microchip [134] have already been glob-topped with an epoxy resin [142] as a standard process in the assembly of IC packages. Note that the position of at least a portion of each OSA module is fixed (under the glob-top) and is relatively well positioned mechanically with respect to the IC package's organic substrate—mainly due to the electrical connections required between the OSA and the organic substrate.

Figure 28A:
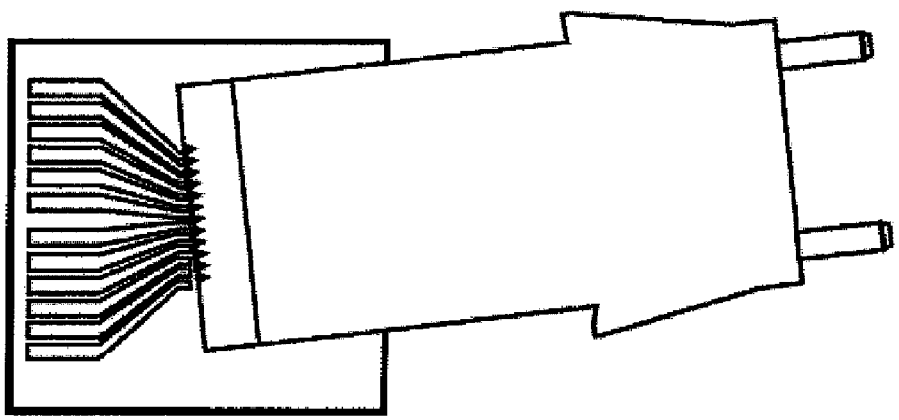
FIGS. 28a, 28b, and 28c are three top views of 3 possible orientations of the augmented optical sub-assembly indicating possible aligned positions, in accordance with an embodiment.
Figure 28B:
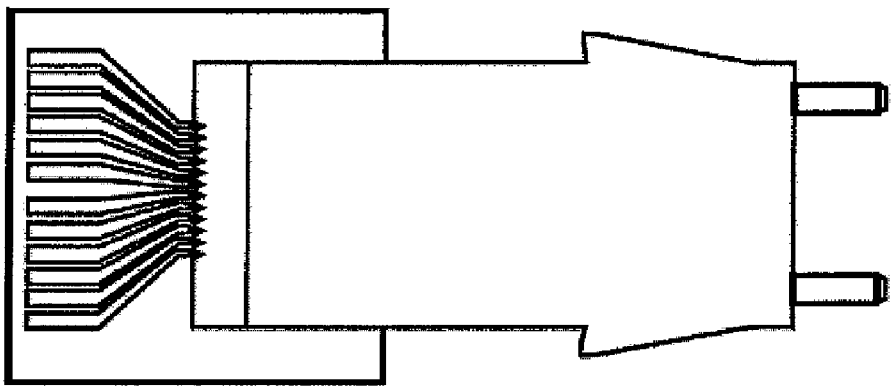
Figure 28C:
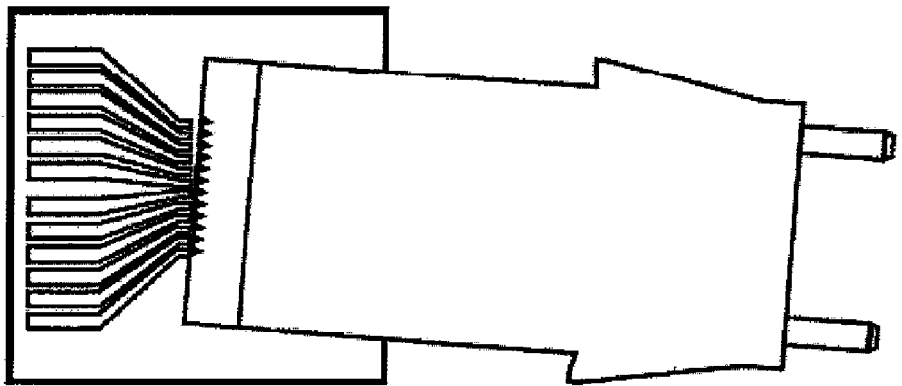
Figure 29:
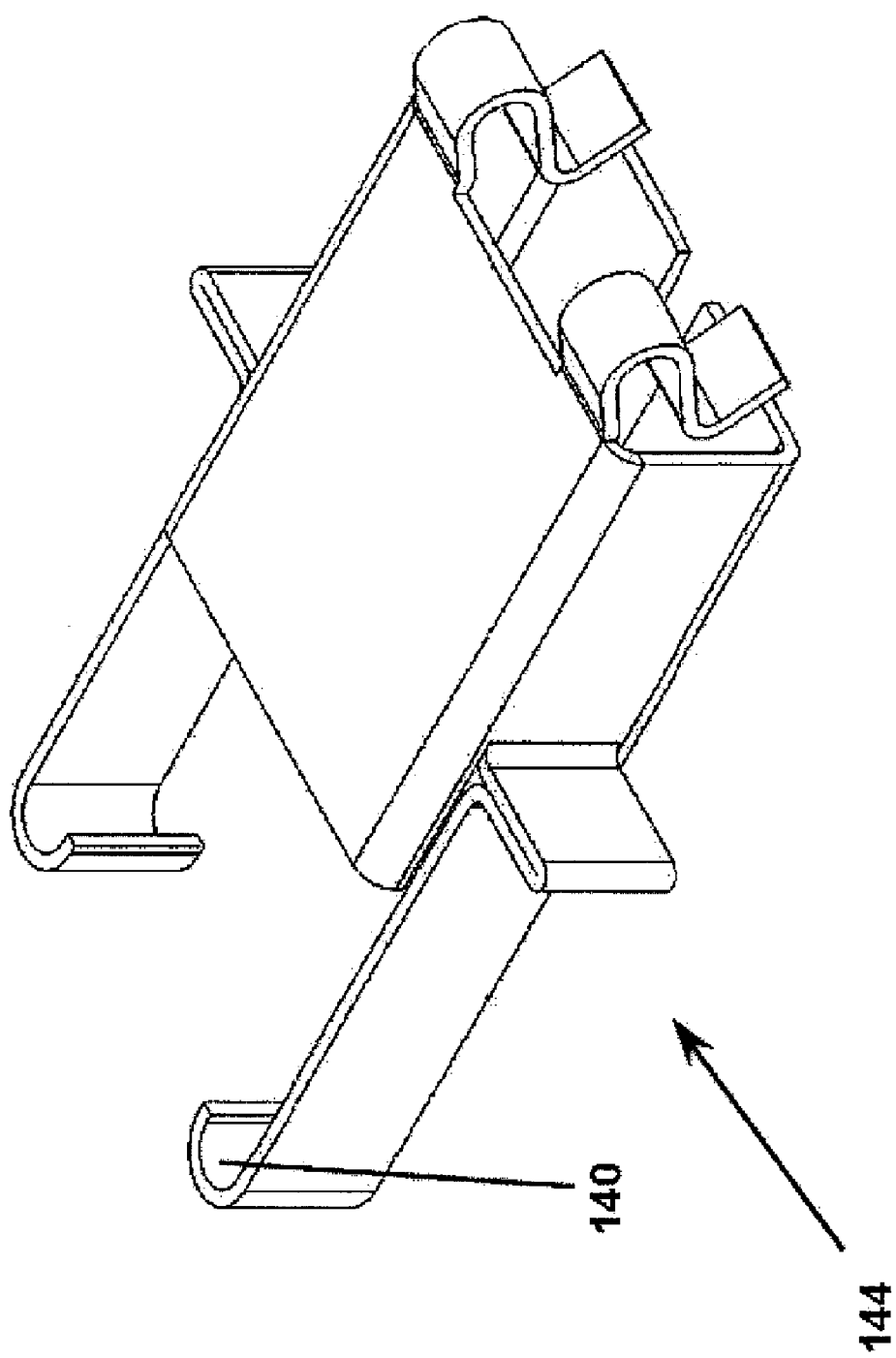
FIG. 29 is a perspective view of an alternate mating clip design, in accordance with an embodiment.

FIG. 28b shows how an optical sub-assembly might ideally appear if all sub-components were perfectly aligned and positioned. However, it is possible that due to the placement of sub-components and their cumulative error in positional tolerance, the optical port interface [110] might NOT be well referenced with respect to its own electrical portion, as shown in FIGS. 28a and 28c. This would result in an OSA whose electrical portion WAS well positioned with respect to the IC package, but whose optical port interface WAS NOT well referenced with respect to the IC package's organic substrate. Thus the need to include mechanical features only on the optical port interface that are independent from the IC package's organic substrate. Therefore, the OSA has been augmented to include features on its sides that are NOT directly part of the IC package, the side flares [138] allow the MT ferrule and optical cable to be optically mated to the optical port of the OSA using the mating clip without the need for perfect registration of the optical port interface with the IC package. The modified mating clip [144], as shown in FIG. 29, is similar to the first embodiment, but the hooks [140] are pointed inwards to grasp the features on the sides of the optical port; i.e.: the flares [138].

Figure 30:
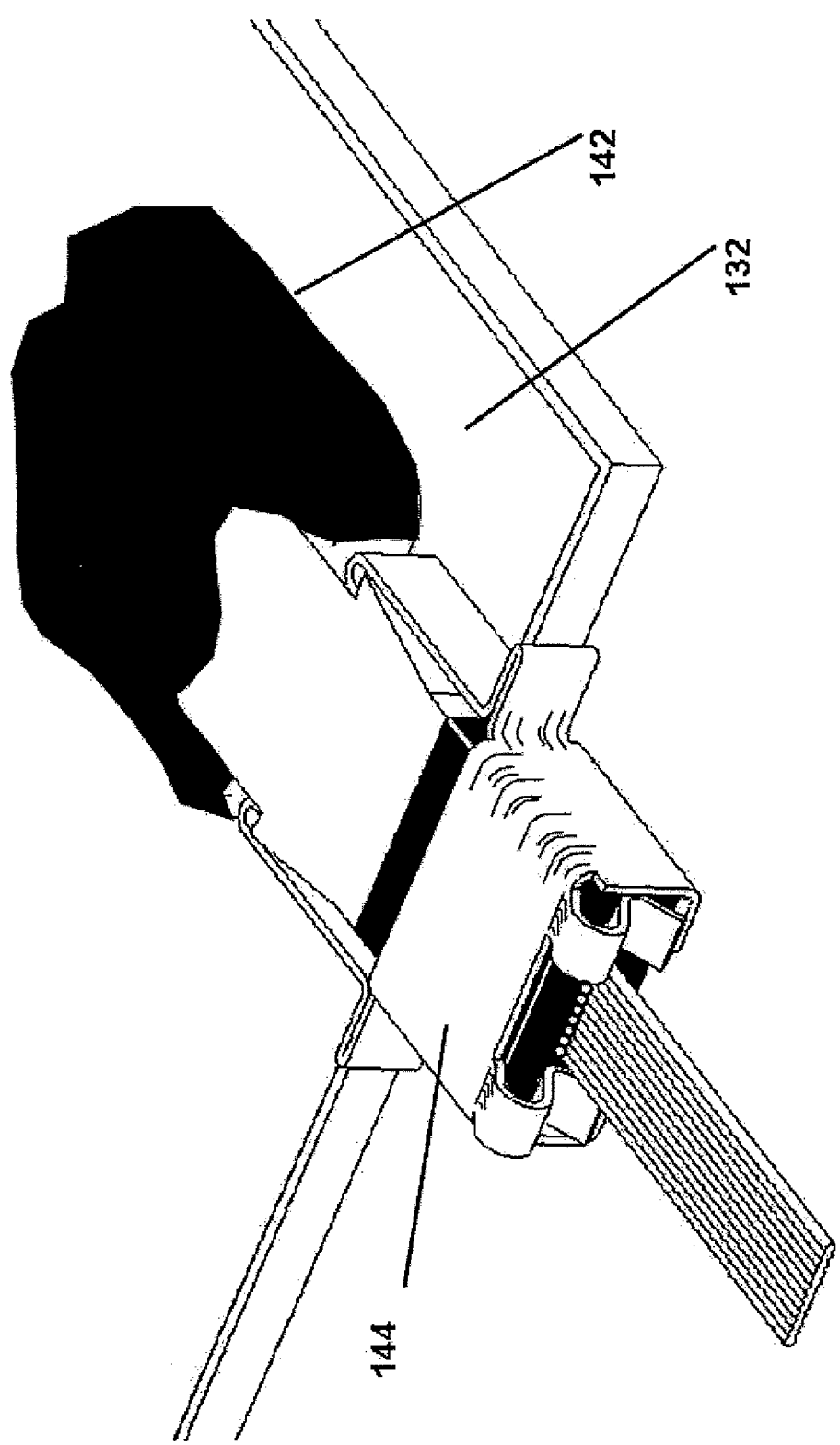
FIG. 30 is a perspective view of the cavity-up IC package where one of its optical ports has the alternate mating clip and MT ferrule connected in accordance with an embodiment.

The final assembly of the MT ferrule and cable, the mating clip and the IC package are shown in FIG. 30. This type of design can be highly beneficial where low-cost, low-tolerance assembly techniques are being employed for both the optical alignment of the OSAs and the assembly of the IC package.

Figure 31:
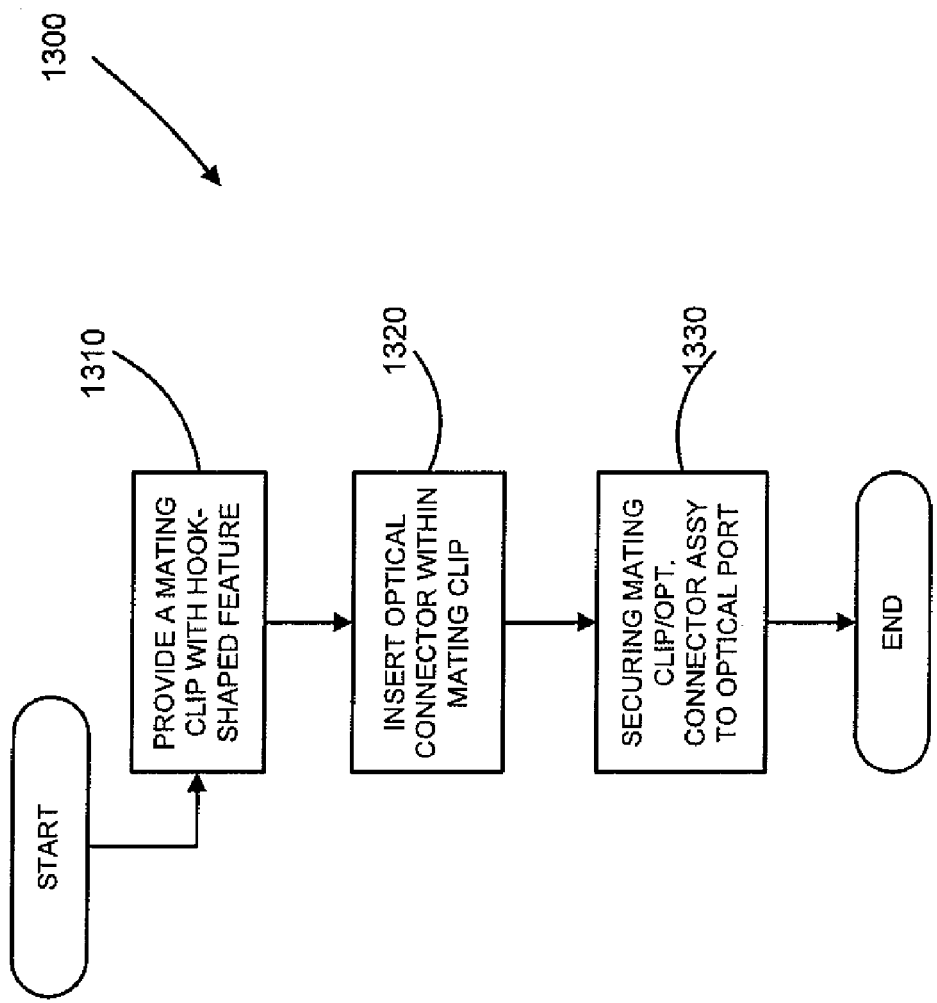
FIG. 31 is a block diagram of a method of using a mating clip according to an embodiment.

Now referring to FIG. 31, there is shown a method 1300 for using a mating clip for securing a connection between an optical connector and an optical port of a hybrid optically enabled integrated circuit package as described herein.

The method 1300 comprises: providing a mating clip having a hook-shaped feature extending therefrom (step 1310); inserting the optical connector within the mating clip, thereby forming an mating clip/optical connector assembly (step 1320); and securing the mating clip/optical connector assembly to the optical port using an interaction between the hook-shaped feature and at least one of a notch internal to the hybrid optically enabled integrated circuit package; and a protrusion on the optical port (step 1330).

The embodiments described above are intended to be exemplary only. The scope of the description is therefore intended to be limited solely by the scope of the appended claims.

We claim:

1. An optically-enabled integrated circuit (IC) package for connecting an electrical printed circuit board (PCB) to an optical fiber, the package comprising:

a substrate comprising a plurality of electrical contacts for providing electrical connections between the package and the PCB;

a user-defined microchip affixed to the substrate, the microchip being electrically connected to the electrical contacts of the substrate; and an optical sub-assembly (OSA) secured to the substrate and comprising:
  an electro-optical device;
  an electrical interface for electrically connecting circuit traces of the substrate to the electro-optical device;
  an optical interface prealigned with the electro-optical device, for optically coupling the electro-optical device to the optical fiber; and
  a mechanical connection between the electrical interface and the optical interface is adapted to permit positional adjustment of the electrical interface relative the optical interface.

2. The package as claimed in claim 1, wherein the mechanical connection comprises an optical ribbon fiber array optically coupled between the optical interface and the electro-optical device of the OSA, a flexibility of the optical ribbon fiber array permitting positional tolerances between the substrate and both of the electrical interface and the optical interface to be greater than an alignment tolerance between the optical interface and the electro-optical device of the OSA.

3. The package as claimed in claim 1, further comprising:
  a housing affixed to the substrate and enclosing the user-defined microchip and the OSA; and
  a mating clip assembly associated with the housing for removably biasing an optical connector of the optical fiber into optical engagement with the optical interface of the OSA.

4. The package as claimed in claim 3, wherein the optical sub-assembly (OSA) is secured to the substrate within the package, between the user defined microchip and a side-face of the housing.

5. The package as claimed in claim 3, wherein the housing comprises a first zone in which is located the user defined microchip and a second zone in which is located the OSA.

6. The package as claimed in claim 1, wherein the electrical interface comprises an electrical interface with gold pads for one of wirebonding and flip-chipping.

7. The package as claimed in claim 1, wherein the optical interface of the OSA comprises a mechanical transfer (MT) multi-fiber optical ferrule having at least one alignment dowel pin.

* * * * *